United States Patent
Lazar et al.

(10) Patent No.: US 9,784,803 B2
(45) Date of Patent: Oct. 10, 2017

(54) MAGNETIC RESONANCE SCANNER WITH ANTENNA SYSTEM

(71) Applicants: Razvan Lazar, Erlangen (DE); Martin Schramm, Erlangen (DE)

(72) Inventors: Razvan Lazar, Erlangen (DE); Martin Schramm, Erlangen (DE)

(73) Assignee: Siemens Aktiengesellschaft, München (DE)

( * ) Notice: Subject to any disclaimer, the term of this patent is extended or adjusted under 35 U.S.C. 154(b) by 792 days.

(21) Appl. No.: 14/250,648

(22) Filed: Apr. 11, 2014

(65) Prior Publication Data

US 2014/0306706 A1 Oct. 16, 2014

(30) Foreign Application Priority Data

Apr. 12, 2013 (DE) ........................ 10 2013 206 557

(51) Int. Cl.
*G01R 33/28* (2006.01)
*G01R 33/56* (2006.01)
*G01R 33/34* (2006.01)

(52) U.S. Cl.
CPC ..... *G01R 33/288* (2013.01); *G01R 33/34007* (2013.01); *G01R 33/56* (2013.01); *G01R 33/34046* (2013.01)

(58) Field of Classification Search
CPC ............ G01R 33/288; G01R 33/34007; G01R 33/34046; G01R 33/34; G01R 33/56; G01R 33/3854
USPC .................................. 324/307, 309, 318, 322
See application file for complete search history.

(56) References Cited

U.S. PATENT DOCUMENTS

| | | | |
|---|---|---|---|
| 6,252,404 B1 | 6/2001 | Purgill et al. | |
| 2004/0061499 A1 | 4/2004 | Stocker | |
| 2005/0258923 A1* | 11/2005 | Arz | G01R 33/3854 335/216 |
| 2007/0285095 A1 | 12/2007 | Nistler et al. | |
| 2008/0211495 A1* | 9/2008 | Steckner | G01R 33/3415 324/300 |
| 2008/0309343 A1* | 12/2008 | Yamamizu | A61B 5/055 324/320 |

(Continued)

FOREIGN PATENT DOCUMENTS

| | | |
|---|---|---|
| DE | 10245942 | 4/2004 |
| DE | 60032976 | 11/2007 |
| DE | 102006019421 | 11/2007 |

OTHER PUBLICATIONS

German Office Action dated Sep. 20, 2013 in corresponding German Patent Application No. DE 10 2013 206 557.4 with English translation.

*Primary Examiner* — Melissa Koval
*Assistant Examiner* — Rishi Patel
(74) *Attorney, Agent, or Firm* — Lempia Summerfield Katz LLC

(57) ABSTRACT

A magnetic resonance scanner includes an antenna system, such as a body coil, mechanically coupled to a support structure, such as a gradient coil, via a suspension system. The suspension system has a setting mechanism in order to reversibly set a coupling parameter value of the mechanical coupling between the antenna system and the support structure and/or a position or location of the antenna system relative to the support structure. The coupling parameter may be set during operation of a magnetic resonance imaging system including the magnetic resonance scanner.

17 Claims, 9 Drawing Sheets

(56) References Cited

U.S. PATENT DOCUMENTS

2014/0306702 A1\* 10/2014 Lazar .................... G01R 33/34
                                                                           324/307

\* cited by examiner

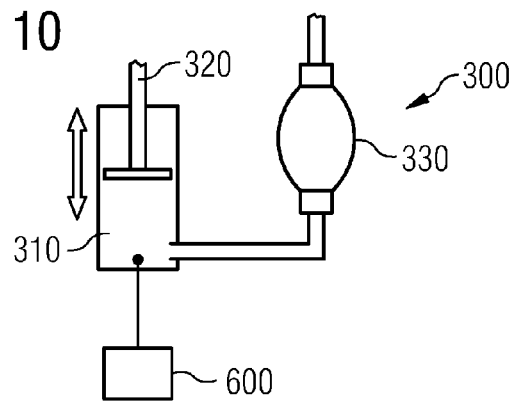
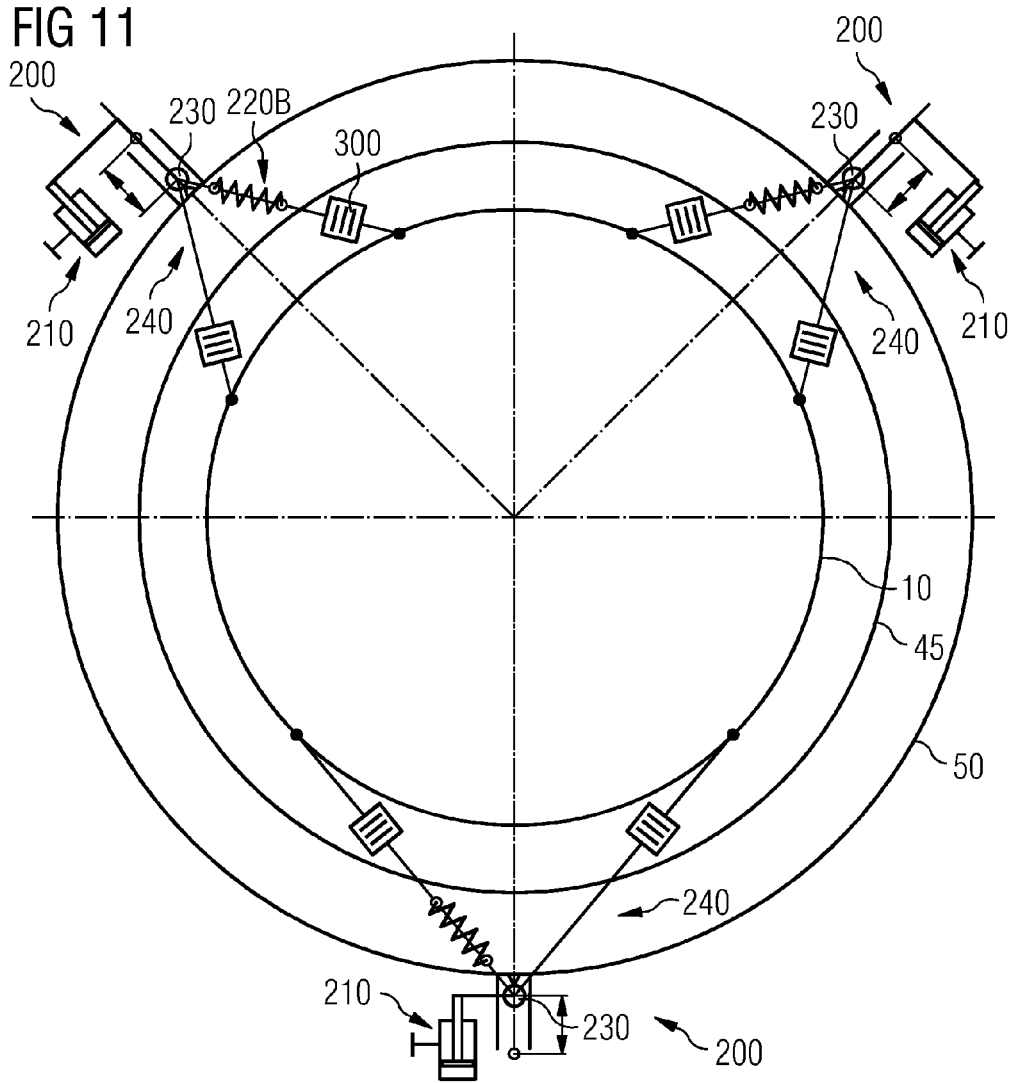

MAGNETIC RESONANCE SCANNER WITH ANTENNA SYSTEM

This application claims the benefit of DE 102013206557.4, filed on Apr. 12, 2013, which is hereby incorporated by reference in its entirety.

BACKGROUND

The disclosed embodiments relate to a magnetic resonance scanner, a magnetic resonance imaging system with a magnetic resonance scanner, and a method for operating a magnetic resonance imaging system with a magnetic resonance scanner.

Magnetic resonance (MR) imaging is a widespread method for obtaining images of the interior of a body. The body to be examined is exposed to a relatively strong main magnetic field, e.g., a strength of several tesla. A radio frequency (RF) excitation signal (the so-called $B_1$ field) is then emitted using a suitable antenna system. The excitation signal tilts the nuclear spins of atoms resonantly excited by the RF field through a particular flip angle relative to the magnetic field lines of the main magnetic field. The RF signal radiated during the relaxation of the nuclear spins, the so-called magnetic resonance signal, is then picked up in suitable antenna systems. The antenna system may also be the same as the transmission antenna system. The raw data acquired is used to reconstruct the desired image data. For spatial encoding, defined magnetic field gradients are respectively superposed on the main magnetic field via gradient coils during the transmission and readout, or reception, of the RF signals. The resulting rapidly switched fields and currents lead to an interaction with the main magnetic field, metallic components of the MR system, or both the main magnetic field and the metallic components. As a result, disturbing vibrations may occur in the MR system that are detrimental to the imaging.

Different types of antenna systems may be used for the transmission and readout, respectively. For example, so-called local coils may be placed on the patient. The local coils may be connected via a suspension system to parts of the magnetic resonance imaging system, such as the patient couch. The local coils may be arranged at a maximum distance of a few centimeters from the patient.

Magnetic resonance imaging systems usually have antenna systems located at a somewhat larger distance from the patient, e.g., a few tens of centimeters. This antenna system may be a so-called body coil. Typically, the antenna elements of the body coil are constructed on a support tube that cylindrically encloses a measurement space of the magnetic resonance imaging system (the so-called patient tunnel).

If the antenna systems are mechanically coupled to parts of the magnetic resonance imaging system, the antenna systems are excited in typical oscillations during operation of the magnetic resonance imaging system by the vibrations that occur during operation. These oscillations are perceptible in various ways. On the one hand, the oscillations may influence the quality of the imaging, or the SAR exposure of the patient. On the other hand, the antenna systems set in oscillation also emit sound that may be unpleasant to a patient.

SUMMARY AND DESCRIPTION

The scope of the present invention is defined solely by the appended claims and is not affected to any degree by the statements within this summary.

The present embodiments may obviate one or more of the drawbacks or limitations in the related art. Oscillations of the antenna system are disturbing, for instance, when the oscillations cause interactions in a frequency range used or relevant in the imaging. Oscillations are alternatively disturbing when the patient comfort is affected during operation of the magnetic resonance imaging system. The relevant frequency range may include, or be formed by, one or more frequency sections separated from one another. The relevant frequency range, frequency section, or frequency sections may be considered relevant with respect to certain criteria, such as image quality or noise generation. The relevant frequency range, frequency section, or frequency sections may be set, calculated or empirically established before or during the construction of a magnetic resonance imaging system. However, the disclosed embodiments may provide the option of setting or establishing the relevant frequency range during operation of the magnetic resonance imaging system.

The relevant (e.g., critical) frequency range may include frequencies at which natural oscillations of an examination object to be imaged by the magnetic resonance imaging system are excited. The excitation of the natural oscillations of the examination object may occur via structure-borne noise. For example, an examination object located on a patient couch is excited (e.g., set) into vibration, e.g., periodic or aperiodic oscillations, directly by the mechanical vibrations of the magnetic resonance imaging system. The relevant frequency range may include cardiac frequencies, frequencies of natural mechanical oscillations of other organs, such as the liver, the kidney, the lung, respiratory rates, natural oscillations of cerebral fluids in a liquid system or similar natural frequencies of the patient, or of the examination object. These natural frequencies may include frequencies in a frequency range of between 5 Hz and 200 Hz.

Another section that may form part of the relevant frequency range relates to frequencies in which artifacts occur in the imaging by the MR system, such as moiré effects that result from the superposition of the spatial encoding frequency with the vibration frequency. These frequencies may be dependent on the spatial resolution or in another way on a magnetic resonance recording to be implemented. In order to establish the relevant frequency range, conventional actuation sequences may be studied empirically or computationally in connection with the corresponding effect on the quality of the imaging in an MR system. The corresponding effect may include the occurrence of artifacts. Based on the study, frequencies are then established at which artifacts occur with a probability that lies above a predetermined minimum probability, and that are consequently associated with the relevant frequency range. The minimum probability may be 80% or more. For example, the relevant frequency range may then include frequencies between 5 Hz and 20 kHz.

A section of the relevant frequency range may include frequencies of acoustically disturbing sound waves. This section may involve the aforementioned structure-borne noise, but also indirectly propagated sound transmitted, for example, by air oscillations. Sound waves are acoustically disturbing when, for example, a threshold volume is exceeded, when the sound includes frequencies perceived as unpleasant (e.g., the monotonous frequency of a dental drill), or both. These frequencies may also be studied empirically or computationally. Based on the study, frequencies at which a maximum volume threshold is exceeded during operation of the magnetic resonance imaging system, frequencies perceived as disturbing, or both, are established and consequently associated with the relevant frequency range. These frequencies may be in the range of between 20 Hz and 20 kHz, and the maximum volume is, for example, up to 90 dB, or up to 99 dB, at the location of the examination object with hearing protection.

The antenna system may be mechanically coupled via a suspension system to a support structure, such as a gradient coil or a patient table of the scanner. Accordingly, the relevant frequency range may include natural frequencies of the support structure, further components of the magnetic resonance imaging system, or both.

The relevant frequency range may also be determined such that the relevant frequency range only includes frequencies, e.g., frequencies of mechanical oscillations of the antenna system, frequencies that may be excited during operation of the magnetic resonance scanner, are relevant. Energy may thus be transferred to the oscillation modes of the antenna system during operation of the scanner.

The disclosed embodiments may be premised upon a magnetic resonance scanner being configured, operated, or both configured and operated such that the antenna system does not contribute, or contributes only to a small extent, to the described interactions in the relevant frequency range.

A magnetic resonance scanner according to one embodiment includes an antenna system, such as a body coil, mechanically coupled to a support structure via a suspension system. The suspension system may have an actuable setting mechanism in order to adjustably (e.g., reversibly) set a coupling parameter value between the antenna system and the support structure, a relative position or location of the antenna system relative to the support structure, or both the coupling parameter value and the relative position. The setting may occur during operation of the magnetic resonance imaging system. The overall system of the antenna system, the suspension system and the support structure may be described or modeled as a system of coupled pendulums. The antenna system predetermines the length of one of the pendulums in the model. The suspension system fixes the coupling parameter value, which may be represented in the model by, e.g., a spring constant of the coupling to the other pendulum. In reality, the other pendulum is represented by the further components of the scanner or the associated magnetic resonance imaging system, such as the support structure.

The coupling parameter value may be modified with the aid of the setting mechanism. The energy transfer between the support structure, which may be formed, e.g., by a gradient coil, and the antenna system, may thus be determined and modified. Specific natural frequencies may thus be removed from the excitation. The oscillation spectrum of the overall coupled system including the antenna system, suspension system and support structure may thus be set such that natural frequencies of the overall coupled system, the antenna system, or both, disposed in the aforementioned relevant frequency range, are avoided.

The disclosed embodiments also relate to a magnetic resonance imaging system including such a magnetic resonance scanner. The magnetic resonance imaging system may additionally have a main control instrument to support the control, regulation, or both control and regulation of the operation of the magnetic resonance scanner for detecting magnetic resonance data.

Furthermore, according to the invention, a method is proposed for operating such a magnetic resonance imaging system. A coupling parameter value of the mechanical coupling between the antenna system and the support structure, a relative position of the antenna system, or both the coupling parameter value and the relative position are set relative to the support structure. Setting or control, regulation, or both control and regulation may occur during operation of the magnetic resonance imaging system, such as when an examination object is disposed on a patient couch. The control, regulation, or both control and regulation may be semiautomatic or automatic. Semiautomatic or automatic may mean that an operator of the magnetic resonance imaging system has the option of influencing or modifying the parameter value location and coupling parameter value. For example, the parameter values location and coupling parameter value are established for the control, regulation, or both control and regulation, and are predetermined semi-automatically or automatically.

In one embodiment, the suspension system may be set between a first coupling parameter value and a second coupling parameter value such that there is a shift of the natural frequencies of the coupled system. In the case of the second coupling parameter value, a (maximum) amplitude of a shifted natural oscillation may be less than the (maximum) amplitude of the non-shifted natural oscillation, which occurs in the case of coupling in accordance with the first coupling parameter value. Relevant frequency ranges of the imaging and/or of the patient comfort during operation of the magnetic resonance imaging system may thus not be excited or only excited to a small extent. By shifting the natural frequency, the natural frequencies of the aforementioned overall coupled system may be shifted out of the relevant frequency range.

The suspension system may also be configured for damped transmission of natural frequencies of the gradient coil or of the support structure. If the suspension system is excited with this natural frequency, oscillation energy is converted into thermal losses. The excitation is thus absorbed as oscillation energy of this natural mode of the support structure in the suspension system. As a result, the transfer of oscillation energy from these natural oscillations to the antenna system may be reduced. The natural oscillations may be excited with particularly high oscillation energy during operation of the magnetic resonance imaging system. For example, this reduction may be achieved via the coupling parameter value being set by selection from a multiplicity of predetermined coupling parameter values. The predetermined coupling parameter values enable this absorption of oscillation energy from the natural modes of the support structure. The selection also enables defined predetermination of a differential frequency, by which the natural frequency of the overall coupled system is shifted.

The suspension system may be set such that setting the location of the antenna system relative to the support structure may be implemented independently of the change in the coupling parameter value. The antenna system may be positioned relative to the support structure such that parts of the support structure may also have a function relative to the antenna system. In the case of the body coil, an RF shield of the gradient coil serving as support structure typically simultaneously carries a return current, which is involved in producing the $B_1$ field. An ideal electrical function of the body coil is only ensured in the case of a concentric arrangement of the body coil and the gradient coil. Any asymmetry in the distance between body coil and gradient coil may warrant an increase in the transmission power of the body coil compared to a concentric arrangement for setting a specific predetermined target magnetization of the examination object. Consequently, the SAR exposure of the patient increases.

This factor may be considered independently of shifting specific natural frequencies by changing the coupling parameter value. The suspension system may be configured such that the setting mechanism may implement the position correction independently of the coupling parameter value adjustment. However, it is also feasible for an additional, second setting mechanism to be present for this separation of functions.

The setting mechanism may include a pressure element that may be filled with a fluid. The pressure element may be connected both to the antenna system and to the support structure. The fluid or filling medium may be air, a suitable oil, nitrogen, helium or the like. For example, the pressure element may be configured as an air cushion, as a cylinder that may be filled with fluid, or the like. The filling pressure in the pressure element may be set or modified, e.g., during the operation of the scanner.

The setting mechanism, e.g., a pressure element, may be connected comprehensively with a drive mechanism. For example, the drive mechanism may include or be configured by a pressure reservoir for the fluid, such as a pump, a compressed air source or gas canister or the like. The drive mechanism may be disposed outside of the scanner.

The magnetic resonance scanner, the suspension system or the setting mechanism may include the drive mechanism.

For example, the setting mechanism may have a spring element with a spring constant that may be set. As a result, the current spring force may be set independently of the deflection/strain of the spring element by setting the spring constant.

The setting mechanism may also include a cable element or a cord element, i.e. a stretchable or elastic cable element. For example, the cable element or cord element may be connected to the spring element that may be set. In particular, the cable tension or cord tension in the setting mechanism may be modified with the aid of the spring element. Therefore, the spring element that may be set forms a drive mechanism to modify a cable or cord tension in the setting mechanism.

For example, the change in cable or cord tension may also be provided (e.g., performed) by a fastening element for direct or indirect fastening, e.g., for connecting the antenna system to the support structure. The fastening element is configured to be movable relative to the support structure, the antenna system, or both the support structure and the antenna system. The fastening element preferably may be connected to the aforementioned cable element or to a cord element.

In order to move the fastening element, the support structure, the antenna system, or both the support structure and the antenna system may have a guidance mechanism, such as a slot, that guides a movement of one or more of the fastening elements. The guidance mechanism may predetermine the movement in terms of direction or movement plane. A synchronized movement of a plurality of the fastening elements may thus correct the location of the antenna system relative to the support structure. The correction may be achieved without a coupling parameter value needing to be changed at the same time. Setting the coupling parameter value may be independent of setting the location of the antenna system relative to the support structure.

The magnetic resonance scanner may have a location determination device. The location determination device may establish the location of the antenna system relative to the support structure. The location may be determined directly or indirectly.

For example, the location determination device may provide a signal for changing the position of the antenna system or the location of the antenna system relative to the support structure. For example, the signal may include information about the absolute location of the antenna system with the relative position of the antenna system relative to the support structure. The location is thus determined directly. Moreover, the signal may contain a trigger signal, which shows that there is asymmetry in the arrangement between antenna system and support structure. The trigger signal may be another suitable signal for implementing control, regulation, or control and regulation of the location of the antenna system. The trigger signal may provide indirect determination of location.

The suspension system may include a plurality of suspension units that connect the antenna system to the support structure at a plurality of different coupling points. Each suspension unit of the plurality of suspension units has an associated setting mechanism. Each suspension unit of the plurality of suspension units includes an associated fastening element for direct, indirect, or both direct and indirect fastening of the antenna system on the support structure. Therefore, a plurality of independent setting options are provided for changing the location, the coupling parameter value, both the location and the coupling parameter value, or a plurality of coupling parameter values. The coupling parameter value for each one of the plurality of suspension units may be set separately.

The magnetic resonance scanner may have a sensor or a sensor arrangement. The sensor or the sensor arrangement may help in establishing the distribution of weight of the examination object to be imaged by the magnetic resonance imaging system on the suspension units. For example, a natural oscillation spectrum or vibration spectrum of the overall coupled system and/or antenna system may be measured, predicted, or both measured and predicted via the sensor or sensor arrangement.

For example, if the patient is loaded onto the couch, the location of the body coil generally shifts relative to the gradient coil. As a result, the effect of the antenna system is not ideal. Moreover, in addition to this shift in location of the antenna system, the distribution of weight also causes a change in the resonance frequencies of the antenna system. The resonance frequencies of the coupled system including the antenna system, suspension system and support structure are also changed as a result of the weight load. For example, if information relating to the distribution of weight is available, these effects may be compensated for, or the impact of the effects in the relevant frequency range may be mitigated, in a targeted manner.

The magnetic resonance scanner may have a sensor element coupled to the setting mechanism, either directly or indirectly. For example, the sensor element may be coupled via a suspension control device. The sensor element is selected from the group including a strain gage, a piezoelectric element, a laser and associated receiver for the radiation from the laser, an ultrasound transmitter and associated ultrasound receiver, a glass rod position determination system, weighing/scales apparatus, accelerometers, such as microelectromechanical system (MEMS) devices, a microphone, a vibration measuring device for MR images that determines a vibration occurring during imaging, a location determination device that determines the location of the antenna system relative to a further component of the magnetic resonance imaging system, such as the support structure based on RF transmission pulses of the antenna system, an electric scattering matrix produced for the antenna system, or both the RF transmission pulses and the electric scattering matrix.

An electric scattering matrix may be created for an RF transmission, reception system, or both an RF transmission and a reception system in order to calibrate or obtain information about the condition of the RF voltage amplitudes and RF voltage phases occurring during operation of the antenna system. For example, the location determination device may be configured such that the location is established via the electric scattering matrix of the antenna system. For example, a threshold is predetermined for each element of the scattering matrix. The threshold establishes that the location of the antenna system relative to the support structure has an inadmissible shift. If one or more of the elements of the scattering matrix used for determining the location exceed the threshold, the statement may be generated from that determination that there is an inadmissible shift in the location of the antenna system relative to the support structure. Correction of the location is warranted until a point at which the scattering matrix only has values that lie within a range predetermined by the thresholds. For example, an iterative method may be used, in which the scattering matrix is determined and a correction of the location of the antenna system is implemented based on the thresholds being exceeded. The iterative method is implemented repeatedly. The threshold may be set as differential value from an element of an electric scattering matrix determined or stored in a preceding measurement. The location may then be determined based on establishing whether the differential value has been exceeded.

For example, the vibration measuring device for MR images may be configured such that image artifacts of MR images are determined based on which vibrations or relevant vibration frequencies (that contribute to producing the artifacts) are established. The established relevant vibration frequencies may be taken into account in the relevant frequency range or the relevant frequency range may include the vibration frequencies. The relevant frequency range may be modified during operation of the magnetic resonance imaging system or also predetermined for the first time at this point.

The sensors may be connected mechanically to an element of the suspension system, antenna system, the support structure, or a combination thereof. A setting mechanism or an associated suspension control device for controlling the suspension system or the setting mechanism may include these elements.

The magnetic resonance imaging system may include a suspension control device configured to control, regulate, or both control and regulate the coupling parameter value, the location of the antenna system relative to the support structure, or both the coupling parameter value and the location. The suspension control device may be part of the scanner or otherwise integrated into the main control apparatus. The suspension control device may be configured to keep the location of the antenna system substantially constant, e.g., based on the location data. Keeping the location constant may result from the position of a body coil being arranged substantially concentrically to a gradient coil.

Controlling, regulating, or both controlling and regulating may be performed based on balancing a vibration or natural oscillation spectrum of the overall coupled system, the antenna system, or both the overall coupled system and the antenna system with the relevant frequency range.

For example, the suspension control device may be a feed-forward control, feed-forward regulation, or both feed-forward control and feed-forward regulation. The control, regulation, or both control and regulation may be based upon a prediction of possible vibrations or impairments of the patient comfort. For example, to this end, future actuation parameters of the magnetic resonance imaging system for producing a magnetic resonance image may be considered during control, regulation, or both control and regulation, such as gradient control parameters, RF control parameters, or both gradient control parameters and RF control parameters.

For example, the prediction here for the feed-forward control, feed-forward regulation, or both feed-forward control and a feed-forward regulation may be implemented by an expert system. The expert system is configured to predict what frequencies are to be assigned to the relevant frequency range. The prediction may be based on the patient data (e.g., individually for each patient). The prediction may be based on the measurement to implemented or future actuation sequence data, and a number of predetermined parameters of the magnetic resonance imaging system, such as parameters of the aforementioned actuation sequence data. The expert system may be configured to estimate or predict the frequency ranges, which were mentioned at the outset and which the relevant frequency range may include, as well as, for example, vibration or natural oscillation spectra that occur during operation of the magnetic resonance imaging system.

The suspension control device may include a sequence interface for actuation sequence data for using the actuation sequence data for controlling, regulating, or both controlling and regulating the coupling parameter value, the location of the antenna system relative to the support structure, or both the coupling parameter value and the location. The actuation sequence data predetermines the generation of magnetic field gradients of the magnetic resonance imaging system for exciting magnetic resonance signals. For example, based on the actuation sequence data, an oscillation spectrum (e.g., a vibration and/or natural oscillation spectrum) to be excited during operation of the magnetic resonance imaging system may be predicted. The prediction may be made by the aforementioned expert system. The predicted spectra may be the spectra of the coupled system including the antenna system, suspension system and support structure. The natural frequencies of the coupled system may be set based on the actuation data or a prediction of one of the above-described oscillation spectra such that the natural frequencies are disposed outside of the relevant frequency range.

For example, the suspension control device may include a weight data interface for weight data. The suspension control device may be configured to use the weight data for controlling, regulating, or both controlling and regulating the coupling parameter value, the location of the antenna system relative to the support structure, or both the coupling parameter value and the location. For example, the weight data may include the weight of an examination object to be imaged by the magnetic resonance imaging system, the distribution of weight of the examination object within the magnetic resonance imaging system, or both the weight of the examination object and the distribution of weight. The weight data may include the division of the weight on individual suspension units of the suspension system. The weight data may be used to establish an oscillation spectrum occurring during operation.

The expert system or the suspension control device may also be connected to sensors. The sensors may also include sensors or sensor arrangements configured to detect the natural oscillations of the examination object mentioned at the outset. For example, the sensors may be an EKG instrument, a respiration sensor or respiration belt or similar sensors, which may establish biological influence variables on the relevant frequency range, such as the frequency of occurrence of a so-called R wave in an EKG signal or the respiration frequency. Moreover, a natural frequency of the examination object, such as a natural frequency of a ventricle filled with cerebrospinal fluid, may be established based on MR images that may be considered in the relevant frequency range.

Furthermore, the antenna system may have an adjustment device for setting the natural frequency of a natural mechanical oscillation mode of the antenna system. The adjustment device may be configured or actuated such that actuation may occur during operation of the magnetic resonance imaging system.

A user or operator of the magnetic resonance scanner is able to set (via a user interface) whether, how, or both whether and how (e.g., with respect to which oscillation plane or which natural oscillation mode) and about which differential frequency a shift in the natural frequency may occur.

The adjustment device may be configured to shift the natural frequency by a predetermined differential frequency. The adjustment device may be configured such that a frequency value is predetermined. A natural frequency is shifted by the frequency value.

A shift in a natural frequency of the antenna system may be achieved via modification of a characteristic length of the antenna system. For example, the characteristic length is a length of a region of the antenna system that has uniform damping properties with respect to the respective oscillation mode. For example, the characteristic length is integral (e.g., made out of one material) and may have an identical geometric form over the entire extent of the characteristic length.

The magnetic resonance imaging system may include a differential frequency control device. The differential frequency control device is configured to control, regulate, or both control and regulate a differential frequency for shifting a natural frequency of the antenna system. The natural frequency of the antenna system may be set or shifted during operation of the magnetic resonance imaging system, e.g., while an examination object is disposed in the magnetic resonance scanner.

In the same manner as the suspension control device, the differential frequency control device may be configured as a feed-forward control, regulation, or both control and regulation device. The differential frequency control device may be connected to the expert system, the above-described sensors, or both the expert system and the sensors. In the same manner as the suspension control device, the differential frequency control device may include a sequence interface, weight data interface, or both a sequence interface and a weight data interface. The differential frequency control device may be connected to the expert system or an expert system configured in the same manner.

The differential frequency control device, the suspension control device, or both the differential frequency control device and the suspension control device may be part of the main control apparatus of the magnetic resonance imaging system. The main control apparatus controls, regulates, or both controls and regulates the acquisition of magnetic resonance data.

The differential frequency control device, the suspension control device, or both the differential frequency control device and the suspension control device may have an adaptive embodiment. An MR measurement (e.g., a sample measurement) may be analyzed automatically with respect to the occurrence of relevant frequencies. There may be an automatic shift in natural frequencies so that the established relevant frequencies no longer occur in connection with a repetition of the MR measurement or a measurement with similar boundary conditions. Both the detected MR image data and the measured values of the aforementioned sensors may be considered. An intervention option for an operator of the MR system may be provided so as to modify or confirm the proposed automatic changes. For example, the modification or confirmation may be performed via a user interface of the MR system, the expert system, the differential frequency control device, the suspension control device, or both the differential frequency control device and the suspension control device.

BRIEF DESCRIPTION OF THE DRAWINGS

FIG. 10 shows a sensor configured to determine the deflection of the body coil relative to the gradient coil.

FIG. 11 shows one embodiment of a body coil connected to a support structure of a magnetic resonance imaging system.

DETAILED DESCRIPTION

Figure 1:
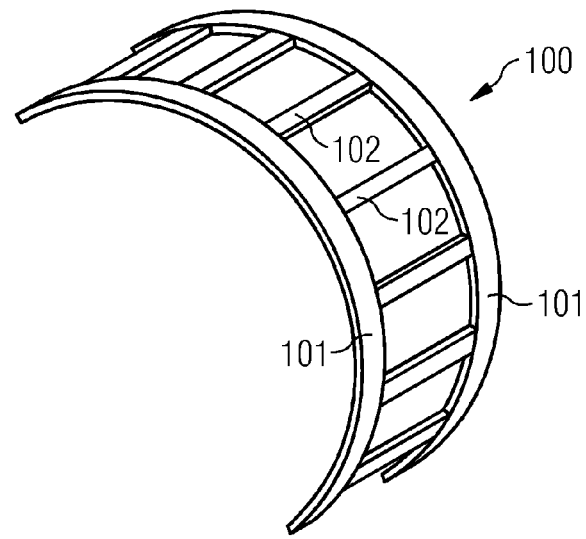
FIG. 1 shows an embodiment of an adjustment device in the form of a ladder-like arrangement of leaf spring elements.

FIG. 1 shows an adjustment device 100 that may be built into an antenna system. The adjustment device 100 is an arrangement of leaf springs or rod springs, which include a plurality of leaf spring elements 101, 102, or spring elements.

Instead of the leaf spring elements 101, 102, round rods or square rods may be used. These spring elements may also be laminated in a composite structure, for example wound tubes. The spring elements may be wound directly into a laminate, or a glass fabric (e.g., fully enclosed by the fabric of the glass structure, such as a glass fiber fabric). The spring elements may also be cast into a glass fabric. The spring element may include or be a bimetallic element, e.g., a combination of metals having different coefficients of thermal expansion, with which a force may actively be generated, for example, by local heating via a heating element.

The leaf spring elements 101, 102 are connected to one another in a ladder-like fashion, e.g., two leaf spring elements extending mutually in parallel. The main spring elements 101 of the ladder-like arrangement are connected to a plurality of leaf spring elements 102 arranged transversely thereto. The transversely arranged leaf spring elements, e.g., the rung spring elements 102 of the ladder-like arrangement, also extend mutually in parallel and are equally separated from the neighboring rung spring element 102, which is arranged in parallel. The combination of a plurality of leaf spring elements 101, 102, which includes at least two leaf spring elements 101, 102 that extend in different spatial directions to one another, is configured to influence a multiplicity of different oscillation planes. The natural frequencies of a plurality of different natural oscillation modes, which may have different oscillation planes in one arrangement, may be varied via the adjustment device 100.

Figure 2:
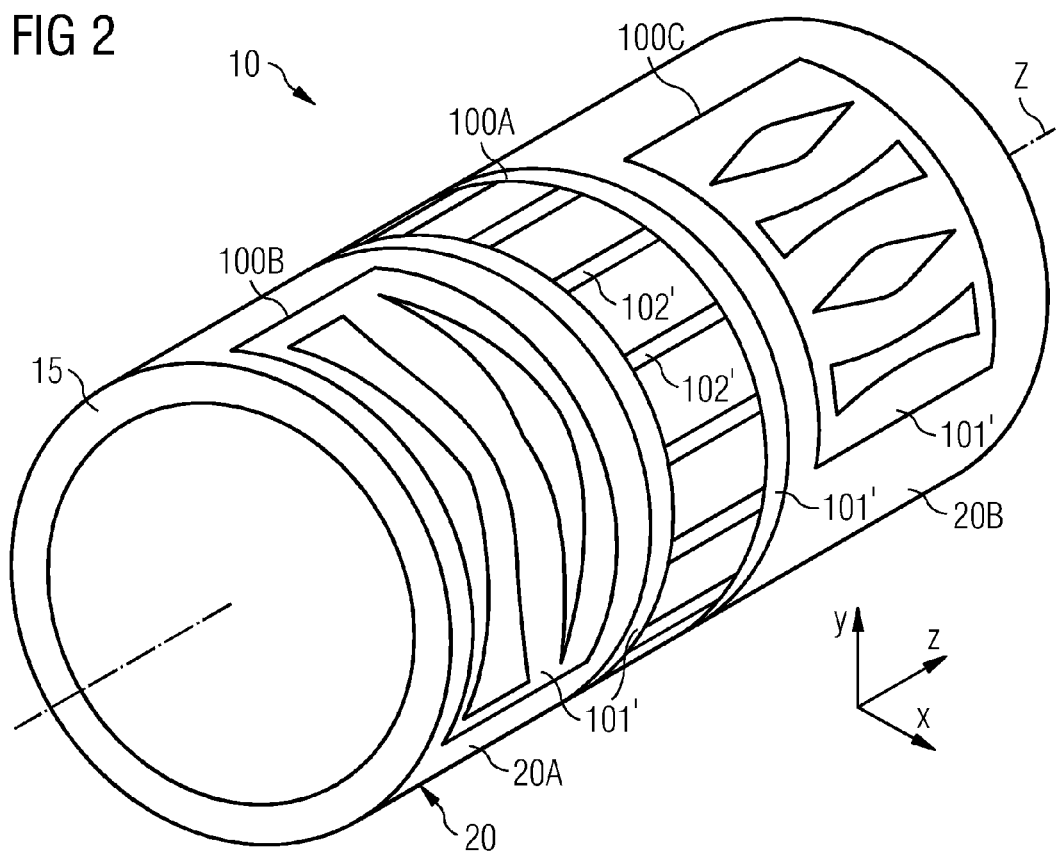
FIG. 2 shows a number of adjustment devices similar to FIG. 1, which are integrated into a support tube of a body coil.

FIG. 2 shows a plurality of adjustment devices 100 according to FIG. 1, which an antenna system 10 of a magnetic resonance imaging system includes. The antenna system 10 is a body coil, which encloses a patient tunnel of the associated magnetic resonance imaging system. A patient couch (not shown) may be shifted in the z-direction and may be disposed in the patient tunnel. The z-direction in this case conventionally coincides with the direction of the main magnetic field of the magnetic resonance imaging system. The body coil 10 is shown schematically and has a plurality of antenna elements 15 that are connected to a support element 20, which is configured as a cylindrical support tube 20. The longitudinal axis of the support tube 20 extends in this case in the z-direction. In this embodiment, the support tube 20 includes a relatively thin, about 10 to 20 mm thick, shell of glass fiber-reinforced epoxy resin. The antenna elements 15 may be configured in this case as metal bars or as plates, and are adhesively bonded onto the support tube or screwed to the support tube 20 via suitable holders, or cast or firmly connected to the support tube 20.

The support tube 20 is subdivided by a plurality of adjustment devices 100A, 100B, 100C (each being configured according to FIG. 1) into a plurality of support tube sections 20A, 20B. The arrangement may be obtained by respectively forming a plurality of windows arranged in the lateral surface of the support tube 20. The adjustment devices 100A, 100B, 100C are placed into the plurality of windows flush so that the circumferential surfaces of the respective window cutouts are connected to the adjustment device 100A, 100B, 100C. The adjustment devices 100A, 100B, 100C then complete the lateral surface of the support tube 20 in the region of the window cutout. To this extent, the adjustment devices 100A, 100B, 100C may also be regarded as integrated into the support tube 20. For example, the adjustment devices 100A, 100B, 100C may be adhesively bonded, screwed or cast with the support tube 20, e.g., firmly connected to the support tube 20, or connected to the support tube 20 in another way, such as reversibly or releasably.

The adjustment devices 100A, 100B, 100C are made of a different material than the other support tube sections 20A, 20B, which are made in particular of epoxide. Subdivision of the support tube 20 may fully divide the epoxide tube into two cylindrical support tube sections 20A, 20B in the direction of the longitudinal axis of the support tube 20, e.g., in the z-direction. The support tube sections 20A, 20B are approximately of equal length in the z-direction. The adjustment device 100A is fitted into the resulting window fully dividing the lateral surface approximately centrally in the z-axis direction. The adjustment device 100A extends over the entire circumference of the support tube 20, transversely with respect to the z-direction, and is an embodiment of the adjustment device 100 of FIG. 1. Unlike the adjustment device 100 of FIG. 1, the two main spring elements 101', extending in parallel, are now configured as spring rings 101' arranged mutually in parallel, concentrically and at a distance from one another. The spring rings 101' follow the cross section of the support tube 20 transversely with respect to the z-direction and divide the support tube 20 in the z-direction into two sections 20A, 20B substantially made of epoxide. The support tube is therefore not made continuously from one material over the entire length thereof in the z-direction. The ladder-like arrangement of leaf springs of FIG. 1 is nevertheless substantially adopted in this case. Rung spring elements 102' are arranged mutually in parallel and in parallel to the z-direction, and are equally separated. The rung spring elements 102' connect the two spring rings 101' and therefore the support tube sections 20A, 20B. The support tube sections 20A, 20B are configured on one end. Each of the support tube sections 20A, 20B includes one of the spring rings 101'. The adjustment device 100A shifts the frequency of a natural oscillation mode by a differential frequency. The natural oscillation mode includes an oscillation in an oscillation plane extending in the direction of advance z. The differential frequency may be set by the length of the support tube sections 20A, 20B in the z-direction and the coupling of the leaf spring elements 101', 102' to one another. The differential frequency may be set by the length of the rung spring elements 102' extending in the z-direction, e.g., by the spacing of the main spring elements 101'.

The adjustment device 100A may also be configured to shift the natural frequency of natural oscillation modes of the body coil 10. The natural oscillation modes have an oscillation plane transverse to the z-direction. The differential frequency may also be established by the mutual spacing of the rung spring elements 102' extending parallel to the z-direction. For example, the differential frequency may also be established by the subdivision of the support tube 20 in the circumferential direction into characteristic lengths with the aid of the rung spring elements 102'.

Alternatively, the support tube 20 may include a plurality of the adjustment devices 100A, which subdivide the support tube 20 along the z-direction into more than two support tube sections 20A, 20B.

In the exemplary embodiment depicted in FIG. 2, the body coil 10 furthermore includes other adjustment devices 100B, 100C. The adjustment devices 100B, 100C substantially correspond to the ladder-like adjustment device 100 according to the exemplary embodiment of FIG. 1. The adjustment devices 100B, 100C are respectively arranged in different support tube sections 20A, 20B resulting from the subdivision by the adjustment device 100A. The adjustment device 100B may be a ladder-like spring arrangement according to FIG. 1. The two main spring elements 101' are arranged parallel to the z-axis. The arrangement of the adjustment device 100C differs in that the main spring elements 101' thereof extend in the circumferential direction. The two adjustment devices 100B, 100C are fitted into matching window cutouts of the support tube sections 20A, 20B, which subdivide the support tube sections 20A, 20B only partially in the circumferential direction, e.g., not fully, in contrast to the adjustment device 100A. The adjustment devices 100B and 100C are produced in one piece.

A characteristic length in the circumferential direction is also thereby established, so that a multiplicity of different natural frequencies may be shifted via an individual ladder-like adjustment device 100A, 100B, 100C.

Natural oscillation modes may, in turn, be modified in their natural frequency by the adjustment devices 100B and 100C such that the natural oscillation modes are disposed outside the relevant frequency range.

The adjustment devices 100B, 100C are fastened on the epoxide parts of the support tube sections 20A, 20B in the same way as the adjustment device 100A.

One or all of the adjustment devices 100A, 100B, 100C may be connected to the outer lateral surface of the epoxide section of the support tube 20. In this case, the adjustment devices 100A, 100B, 100C may be easily fitted reversibly or releasably to the support tube 20, e.g., screwed or clamped between two holders.

Figure 3:
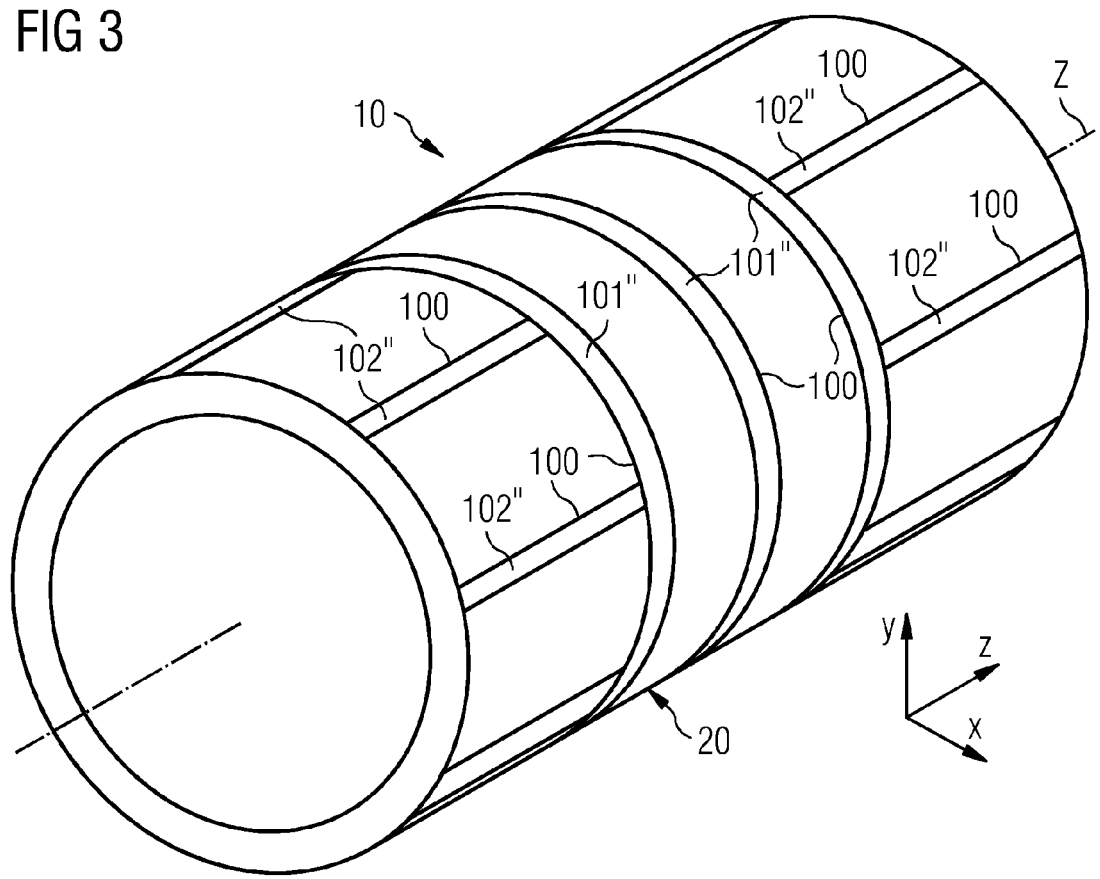
FIG. 3 shows one embodiment of a support tube of a body coil, which is connected to leaf spring elements.

FIG. 3 shows an embodiment in which individual leaf spring elements respectively subdivide the support tube 20 of the body coil 10 into a plurality of characteristic lengths. In this case, in end sections of the cylindrical body coil (e.g., sections which include the opening of the body coil), the leaf spring elements are integrated into the support tube 20. For example, the leaf spring elements are embedded or fully cast into the epoxide material, such that it is subdivided in the circumferential direction into a plurality of sections having characteristic lengths. The leaf spring elements (e.g., the adjustment devices 100) may be directly embedded individually into the epoxide material of the support tube 20, so that the leaf spring elements are accessible via the lateral surface of the support tube. For example, matching grooves for receiving the leaf spring elements may be milled, or formed in another way, into the epoxide section of the support tube. In contrast to the windows, the grooves do not form a complete opening of the lateral surface of the support tube 20.

The leaf spring elements, or the adjustment device 100, may be placed on a uniformly extending section of the epoxide surface of the support tube 20.

In a central region of the support tube 20, other adjustment devices 100 are in turn arranged in the form of spring rings 101" extending in the circumferential direction of the support tube 20. The arrangement subdivides the support tube 20 into characteristic lengths in the z-direction. With the combination of spring rings or spring elements 101", 102" which differ in respect of their orientation and shape, natural frequencies of a multiplicity of natural oscillation modes may be shifted such that the natural frequencies are disposed outside the relevant frequency range, e.g., by a defined differential frequency.

Alternatively, the described spring rings or spring elements 101", 102" may be configured by cables or cords, which may be configured elastically.

Figure 4:
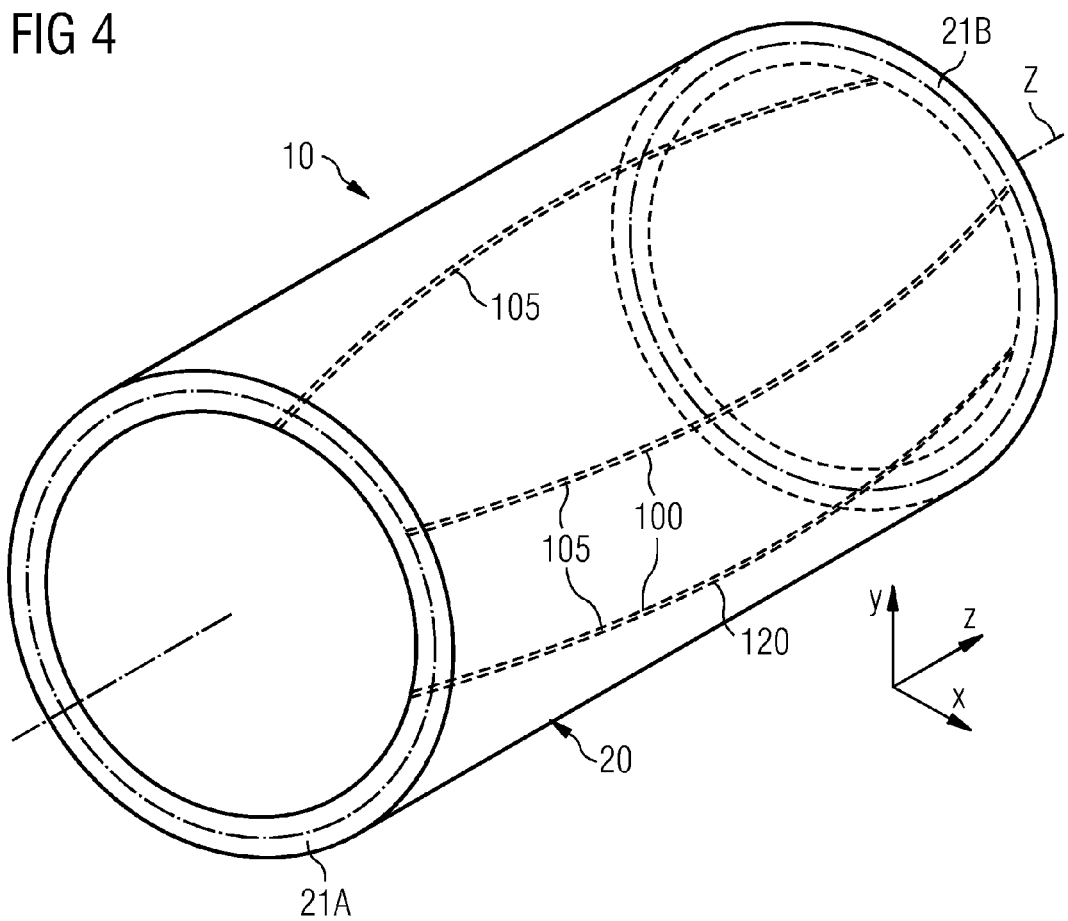
FIG. 4 shows one embodiment of a cylindrical support tube of the body coil, a plurality of adjustment devices extending over the entire length of the cylinder, in the form of stress and strain elements, and being respectively connected at the cylinder ends to the support tube.

FIG. 4 shows another embodiment. In a similar way to the individual leaf spring elements of FIG. 3, the body coil 10 includes an adjustment device 100 having a narrow flexible cord element 105, which is respectively connected to opposite end faces 21A, 21B of the support tube 20. The end faces 21 respectively form a ring of an epoxide material. The radius of the ring is 10 to 20 mm greater than the radius of a circular opening hole for a cylindrical patient tunnel, with which the support tube 20 is concentrically arranged. The cord element 105 extends substantially parallel to the z-direction and is connected to the respectively opposite end face 21A, 21B of the support tube 20. For example, the cord element 105 is adhesively bonded, screwed or clamped between the end faces 21A, 21B, so that a form-fit connection to the end faces 21A, 21B is achieved. The adjustment device 100 includes a plurality of cord elements 105.

Alternatively, the cord element 105 may also be replaced by a leaf spring element, a tensioning cable, or both a leaf spring element and a tensioning cable.

The cord elements 105 may be configured from polyester, polyamide, high molecular weight polyethylene (e.g., Spectra) or Kevlar, or include these materials. Metal strings, such as those used in musical instrument manufacture, may be used. The leaf spring elements may be made of or include beryllium/copper alloys, laminar fiber composites (e.g., carbon fibers or fiberglass), multilayer bonded wood elements or ferromagnetic spring elements having low magnetic properties. As a result, the cord elements have a geometrical shape (e.g., a cord diameter), which keeps the formation of magnetic clusters small. The diameter may therefore lie in a range of less than 5 mm. The cord elements or leaf spring elements may be configured from a nonconductive material.

The cord elements or leaf spring elements or tensioning cables are connected with a pre-stress to the support tube 20. The profile "substantially parallel to z" means in this case that the cord elements or leaf spring elements may also have a deflection in a spatial direction transverse to the z-direction in their profile, albeit a deflection less than half the element length in the z-direction.

An additional stress element (not shown) to permit this deflection is useful in the case of the cord elements 105. For example, the cord element 105 may have a further point of connection to the support tube 20 in the profile thereof. A cord tension may thus be specified, e.g., to set the deflection relative to the z-axis.

In one embodiment, a shift of the frequency of natural oscillation modes also occurs in the xy-plane, which extends transversely to the z-direction.

The support tube 20 may be subdivided into a plurality of characteristic lengths by the multiplicity of adjustment devices 100 or cord elements 105 in the circumferential direction, e.g., transversely to the z-direction. As a result, a shift of the natural frequency of natural oscillation modes having an oscillation plane disposed in the xy-plane again occurs. With the arrangement shown, natural oscillations whose oscillation plane includes the z-direction, on the other hand, are mainly damped, although the damping may also be associated with the shift of a natural frequency of the antenna system.

To this extent, the cord elements 105 or leaf spring elements simultaneously form the damping elements 120. Moreover, the spring elements of the embodiments of FIGS. 1 to 3 also have damping properties.

The embodiments of FIGS. 1 to 4 respectively show achievement of a static shift of the natural frequency of a natural oscillation mode by a predetermined differential frequency by design or structural measures being implemented beforehand. To this end, the relevant frequency range may, for example, have been set or established during the construction of the magnetic resonance imaging system, for example, as described above.

The weight of a patient supported on a patient couch in the magnetic resonance imaging system, or MR system, may influence the shift of the natural frequency of the antenna system either directly or indirectly. On the one hand, when the antenna system is connected to the patient couch, a natural frequency of the antenna system may already be shifted so that another differential frequency results therefrom.

The differential frequency that shifts the natural frequency of a natural oscillation mode may then be set such that there is a safety frequency distance of the shifted natural frequency from the relevant frequency range. For example, the considerations described above relative to setting the relevant frequency range thus need not be implemented individually for the patient. For example, a standard patient may be used. Representative variation ranges of parameters of the standard patient may be established, and the shift of the natural frequency may be established based on the variation ranges of the safety distance.

On the other hand, the natural frequencies of the other components of the magnetic resonance imaging system, or a combination of components of the MR system, such as a combination of the antenna system with the aforementioned support structure of the antenna system, may also be influenced. As a consequence of the patient weight, the relevant frequency range may also change. This change leads to a change in the predetermined differential frequency. This consideration may also be incorporated in the safety frequency distance.

In any purely static setting of the natural frequencies, it may be difficult to find a suitable prediction or setting of the relevant frequency range in which frequency ranges are still free, and in which vibrations of the antenna system are permissible. Only then is it not useful to damp the entire oscillation spectrum of the antenna system. Non-relevant frequency ranges may be predicted or established in a much better way if the prediction is implemented individually for the patient. In the case of an individual prediction for the patient, the relevant frequency ranges may be estimated or calculated more accurately, and therefore more narrowly.

It may therefore be useful if the shift of the frequency of a natural oscillation mode is not implemented statically. The shift may instead be set during operation of the magnetic resonance system.

Individualized or customized predictions of the relevant frequency range for patients may then be made, and a suitable individualized or customized setting of natural frequencies for the patient may be implemented dynamically.

A customized setting for the patient may be implemented with minor modifications to the exemplary embodiments of FIGS. 1 to 4.

In the exemplary embodiment of FIG. 4, each of the ring-shaped end faces 21A, 21B may be rotatable about the z-axis. As a result, the cord element or leaf spring element is respectively connected on the end to a rotatable ring (e.g., respectively to one of the end faces). With the aid of the two rings assigned to the respective cord element or leaf spring element, the position and end points of the cords or springs may be adjusted over the profile of the circumferential line of the cylinder opening of the support tube 20. If there are a plurality of cord elements 105 or spring elements, as depicted in FIG. 4, and the plurality of cord elements 105 or spring elements are respectively connected on the end to different rings 21A, 21B, then the end points of the cord elements 105 or leaf spring elements (e.g., relative to one another) may be adjusted in the circumferential direction of the support tube 20. In this way, the subdivision of the circumference of the support tube 20 into a plurality of characteristic lengths may be adapted and modified during operation of the magnetic resonance imaging system. The shift of the frequency of the natural oscillation mode having an oscillation plane in the x/y-direction may be adapted. At the same time, the length of the region spanned by an individual cord element 105 may be modified. The modification may result from the rings 21A, 21B on the end side, which are connected to a particular cord element 105, being adjusted in different rotation directions from one another. In this way, for example, adaptation of the shift of the natural frequency of a natural oscillation mode may also be achieved by modification of characteristic lengths having an oscillation plane in the z-direction.

The stress element referenced with respect to the cord element 105 may also be provided for a leaf spring element. This stress element may, for example, be configured like an actuatable actuator or setter 110 described in more detail with reference to FIG. 6. However, any other device that permits deflection of the cord element 105 or the leaf spring element transversely to the z-direction may also be used. A variation of the stress or pre-stress of the cord elements or leaf spring elements may then, for example, implemented via the actuatable stress element.

Figure 5:
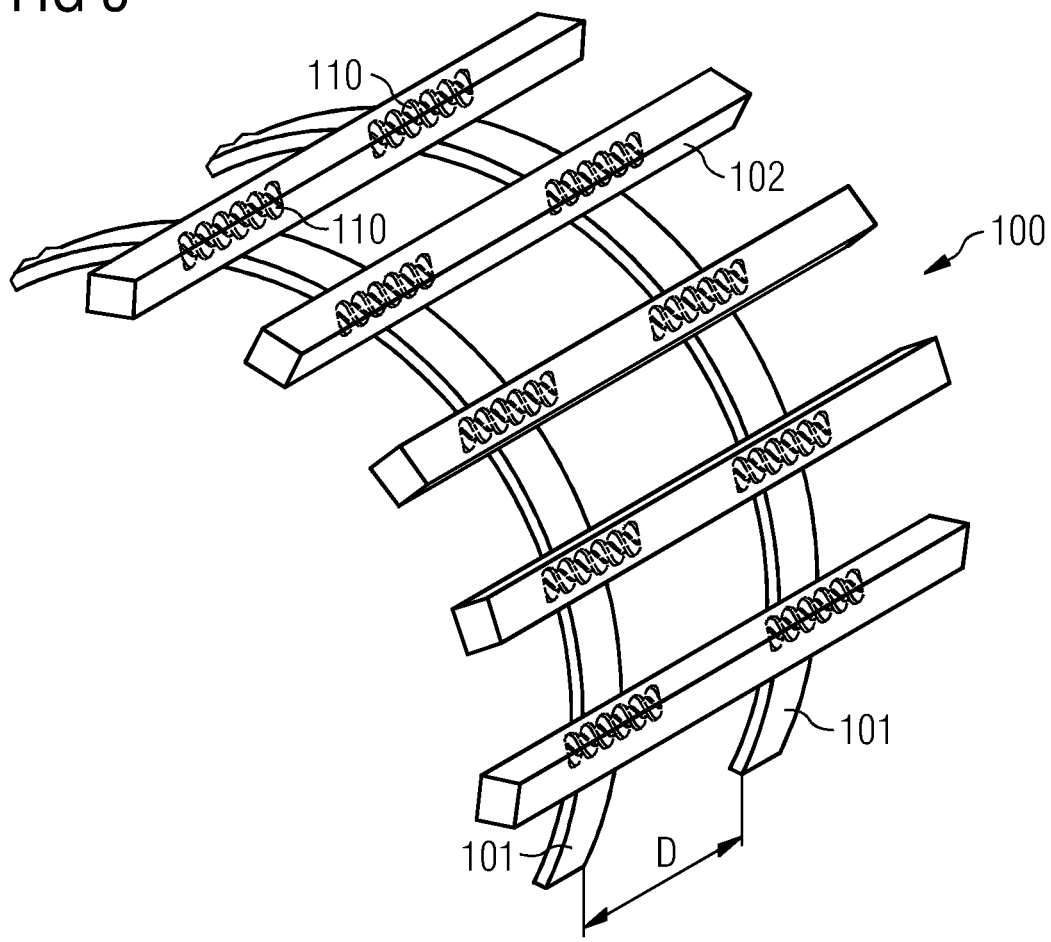
FIG. 5 shows one embodiment of the adjustment device of FIG. 1, which is adjustable.

FIG. 5 shows a variant of the ladder-like adjustment device 100 of FIG. 1 that includes an arrangement of a plurality of leaf spring elements 101, 102. Two longitudinally extending leaf spring elements 101, the main spring elements 101, are in this case disposed at a distance D from one another. These longitudinally extending leaf spring elements 101 are furthermore movably connected to leaf spring elements 102 (e.g., the rung springs 102) arranged transversely to the leaf spring elements 101. The distance D between the longitudinally extending leaf spring elements 101 may be varied by actuators or positioner (e.g., setters) 110, e.g., a plurality of adjustment units, all of which are associated with an adjustment device. Each positioner 110 is respectively configured by a threaded section. The positioners 110 may adapt an arrangement of leaf spring elements according to the exemplary embodiment of FIG. 2 or 3. As a result, a plurality of differential frequencies may be established during operation of the assigned magnetic resonance imaging system.

Figure 6:
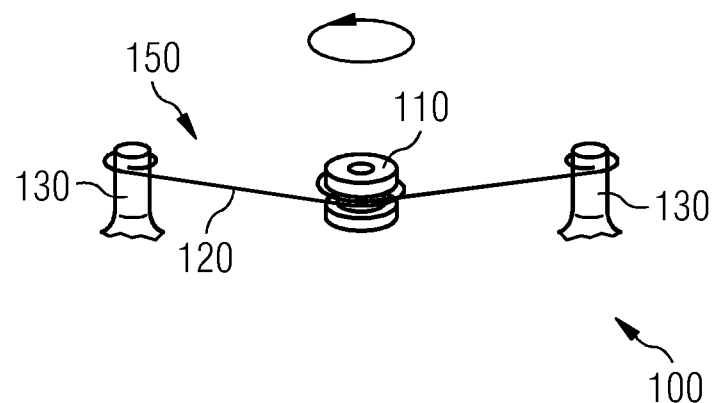
FIG. 6 shows an adjustment device in the form of an adjustable tensioning device.

FIG. 6 shows an adjustment device 100 configured as a tensioning device 150. The tensioning device 150 includes two fastening elements 130 arranged at a distance from one another. The fastening elements 130 are configured in the shape of rods in this exemplary embodiment. The fastening elements 130 may be connected to the lateral surface of the body coil or on the support tube, and are used as holders for a tensioning cable 120. The holders may be configured in a different way, for example, as a hook or as a ring. The fastening element 130 may be contained in one piece in the support tube 20. The tensioning cable 120 is respectively connected at the end to the holders 130. The tensioning cable 120 may be made of a nonconductive material, such as synthetic fibers or nonmagnetic steel wires, and may be elastic to a certain extent. The tensioning cable 120 may therefore also be used as a damping element 120. The cable 120 is connected to an actuator or positioner (e.g., setter) 110, which may vary the cable tension. The positioner 110 may be configured as a controllably driven roll 110, around which the tensioning cable 120 is wound. By rotating the roll 110, the number of turns of the tensioning cable 120 extending around the roll 110 may be adjusted. Alternatively, the proportion of the length of the tensioning cable 120 that extends around the roll 110 may be adjusted. The cable tension acting on the fastening elements 130 may thereby be modified. Overall, an actuatable adjustment device 100 configured as a tensioning device is provided. If, for example, the tensioning device is connected to the support tube 20 of the body coil 10, then a reversibly variable force may be applied to the section of the support tube 20 extending between the fastening elements 130. This force may be described by a modified Young's modulus of the support tube 20, so that a shift of natural frequencies may ultimately be rapidly calculated analytically with the aid of the modified Young's modulus. As a result, one or more predetermined differential frequencies may be established rapidly and in a controlled way.

Figure 7:
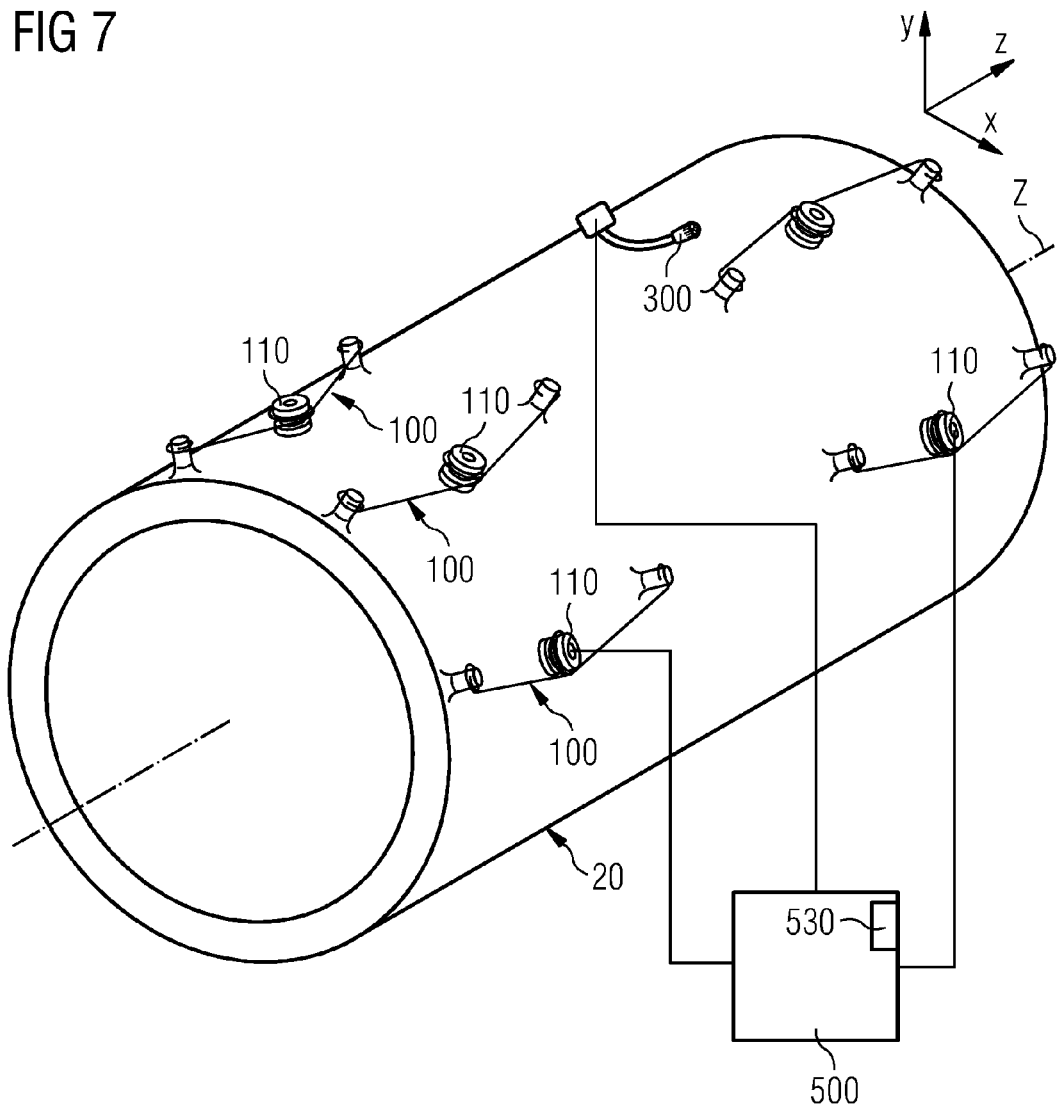
FIG. 7 shows an arrangement of the plurality of adjustment devices of FIG. 6, which are connected to an outer side of the support tube of a body coil and which are adjustable by a differential frequency control device during operation of the associated MR system.

FIG. 7 shows an arrangement of a plurality of adjustment devices 100 configured in accordance with the embodiment of FIG. 6. A plurality of adjustment devices 100 are in this case arranged on an outer surface (e.g., the lateral surface) of the support tube 20 of the body coil 10. The tensioning device or the cable 120 in this case extends parallel to the z-direction. With the aid of the setters 110, each adjustment device 100 of the plurality of adjustment devices 100 may be set individually. As a result, each adjustment device 100 respectively exerts a force in the longitudinal direction, e.g., parallel to the z-direction, over a respective section of the support tube 20. Because the action of each force may be set differently via the plurality of setters 110, the support tube 20 may be divided into a plurality of sections, or characteristic lengths, both in the longitudinal direction of the support-tube cylinder and in the plane transverse to the z-direction. Almost any desired shift of natural oscillation frequencies may be achieved. In addition to shifting the natural oscillation frequencies, damping is simultaneously established via the cable 120. In this case, the cable 120 itself acts as a damping element 120, and the damping properties of the support tube 20 itself are also modified by the controlled variation of the Young's modulus of the support tube 20.

As a result, in addition to the shift of the natural frequencies, certain frequencies (e.g., natural frequencies of the antenna system 10) may be damped. The damped frequencies may also be selected. The selection may be independent of the shift of the natural frequencies of the antenna system 10. This independence may be achieved, as shown, via a plurality of adjustment devices 100, each of which may be adjusted independently of one another.

The independence of the selection and the shift may be useful in various ways.

The oscillation energy transfer to the antenna system may be reduced by the occurrence of a frequency shift. In addition, frequencies that, for example, correspond to a natural frequency of a support structure, may be damped, as described in more detail below.

Damping of odd harmonics and generation of a multiplicity of even harmonics may be achieved via the damping. For example, the damping may be with respect to a natural frequency of the antenna system 10 and/or of other components or combinations of components of the magnetic resonance imaging system, which have the greatest amplitude during operation of the magnetic resonance imaging system. As a result, the noise spectrum, which may be propagated by vibration of the body coil, is perceived as pleasant by the patient.

Devices based on pneumatic, hydraulic, piezoelectric or magnetic force may be used as a drive mechanism to, for example, vary the cable tension or act as actuators.

The drive means may in this case include hydraulic or pneumatic pumps, motors, piezoelectric elements, magnets (e.g., electromagnets), hydraulic or pneumatic muscles, pressure elements, or heating elements. The cable tension may in this case, as shown, be varied by a force acting in a central region of the tensioning cable 120. The cable tension may be varied by a force acting, for example, on an engagement point at the end, as explained with reference to FIG. 4.

The drive mechanism may also be used to adjust the cord elements or spring elements.

The drive mechanism may in this case be actuated via a differential frequency control device 500. The differential frequency control device 500 may be configured for dynamic establishment, e.g., individually for the patient, of the relevant frequency range. The differential frequency control device 500 may also have a frequency range interface 530 for receiving a dynamically established relevant frequency range. The interface 530 may, for example, also be used in order to convey a specification for a differential frequency.

Furthermore, the differential frequency control device 500 may be connected to one or more sensors 300 that acquire vibrations of the antenna system 10, of other components of the magnetic resonance imaging system, or of both the antenna system 10 and other components. In one embodiment, a microphone is arranged in the immediate vicinity of the support tube 20 so that the microphone may detect the sound emission of the support tube 20, and therefore the vibrations of the antenna system 10, during operation. Based on the sensor measurement data, these sensors 300 may then set a differential frequency used to shift a natural frequency of the antenna system 10.

Figure 8:
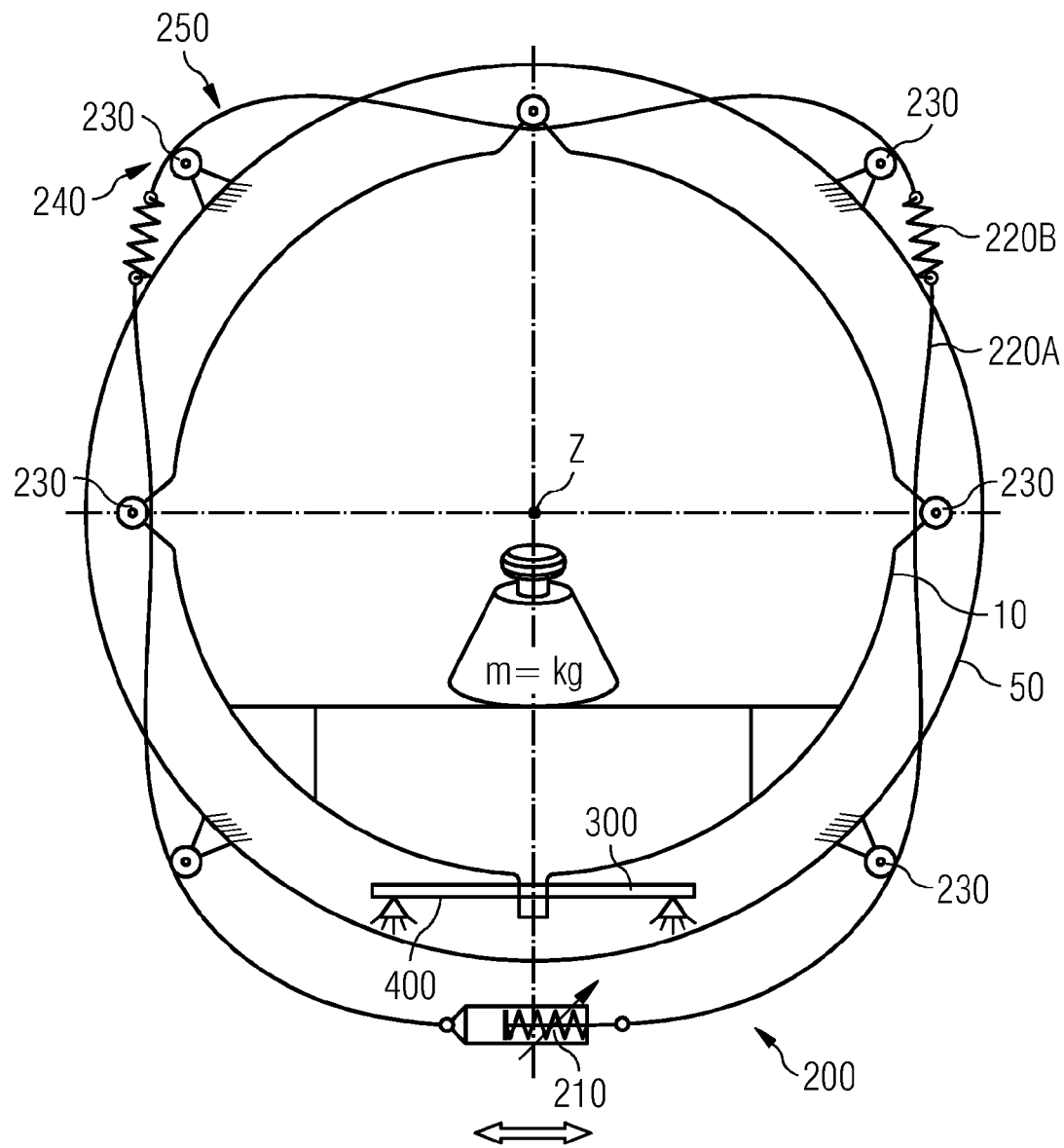
FIG. 8 shows a body coil connected to a gradient coil via a suspension system that includes a cable, the tension of the cable being adjustable via a controllable actuator.

During the variation of natural oscillations for improving the image quality or the patient comfort, the body coil 10 may be connected to the gradient coil 50 via a suspension system 200, as is shown in FIG. 8. The gradient coil 50 may be used as a support structure 50 for the body coil 10.

Alternatively, the body coil 10 may be connected to a main field magnet of the magnetic resonance imaging system (or the housing thereof). The main field magnet is then used as a support structure 50, as shown in more detail in FIG. 11.

As a result, the excitation of natural oscillation modes of the antenna system 10 is also determined decisively by the transfer of oscillation energy of the support structure 50 to the suspension system 200, and consequently to the body coil 10. Reduced transfer of oscillation energy leads to reduced vibrations of the antenna system 10.

The transfer of oscillation energy to the body coil 10 via the suspension system 200 may be described as a model (or modeled) by a coupling parameter value. The coupling parameter may be a spring constant of the coupled-pendulum model.

FIG. 8 shows an examination object O, or patient, symbolized by a weight, disposed in the patient tunnel of the magnetic resonance imaging system 1. The patient O has a mass m. Because the patient table (not shown) on which the patient lies is mounted inside the support tube 20 of the antenna system 10, the antenna system 10 is deflected by a certain distance relative to the gradient coil 50 by the mass m. Furthermore, the amount, the position and the distribution of the weight m of the patient O also determine possible natural frequencies of the antenna system 10 and furthermore of the coupled system including the antenna system 10, suspension system 200 and support structure 50.

A shift or displacement of the antenna system 10 relative to the gradient coil 50 is therefore also disadvantageous because an RF shield of the gradient coil 50 concurrently carries a return current used to generate the $B_1$ field. Only with a concentric arrangement of the body coil 10 and the gradient coil 50 is an optimal electrical function of the body coil 10 provided (e.g., ensured). Any asymmetry in the distance between the body coil 10 and the gradient coil 50 may lead to having to increase the transmission power of the body coil 10 relative to a concentric arrangement, to establish a given predetermined target magnetization of the examination object. One consequence of this increase is an increase in the SAR exposure of the patient.

Correction of this weight-dependent shift or displacement, individual to the patient, of the antenna system 10 relative to the gradient coil 50 is thus useful.

The suspension system 200 is configured in the exemplary embodiment of FIG. 8 by a multiplicity of fastening elements 230 in the form of rolls 230. The rolls 230 and an associated holder form a suspension unit 240. The rotation axis of the rolls 230 in this case extends parallel to the z-direction. A first set of four rolls 230 is mounted on holders connected to an outer surface of the body coil 10. These four rolls 230 are distributed uniformly over the circumference of the lateral surface of the cylindrical body coil 10. A second set of four rolls 230 is arranged on an outer surface of the gradient coil 50. The four rolls 230 of the second set are uniformly distributed over the circumference of the lateral surface of the cylindrical gradient coil 50. A tensioning cable 220A extending around the outer lateral surface of the body coil 10 is guided by the eight rolls 230. As a result, the contour of the cable 220A has the cable 220A guided in continuous succession around one roll 230 connected to the body coil 10, and then immediately and subsequently around a roll 230 connected to the gradient coil 50. The cable has a plurality of additional damping elements 220B in the form of springs 220B. The location of the antenna system 10 relative to the gradient coil 50 may be set by a positioner (e.g., setter) 210 in the form of a spring element, which may be regulated. The setter 210 is contained within the extension of the cable 220A. The setter 210 forms an actuatable setting mechanism of the suspension system 200. The magnetic resonance scanner 2 has a sensor 300 in the form of a glass rod element, which is simultaneously part of a location determination device 400. With the glass rod element, on which a pattern of optically transmissive and optically opaque regions is applied as an information medium, a location change of the antenna system 10 may be detected and quantified. A relative location of the antenna system 10 with respect to the body coil 10 may be established. To this end, the glass rod element is illuminated with the aid of a laser (not shown) and a resulting light intensity is evaluated. From this, it is possible to calculate the relative position of the antenna system 10 with respect to the support structure 50, or the deflection of the antenna system 10 relative to the support structure 50. The information about the deflection may be used to reset the location of the body coil 10 concentrically with the gradient coil 50 via the setter 210 by, for example, varying the spring hardness.

Furthermore, time-dependent detection of the deflection of the body coil 10 relative to the gradient coil 50 may be used to establish a natural frequency spectrum of the antenna system 10, of the coupled system including the antenna system 10, suspension system 200 and support structure 50, or of both the antenna system 10 and the coupled system.

This establishment of the natural oscillation frequency spectrum is then implemented dynamically during operation of the MR system, while considering the weight of the patient. From this, a differential frequency may be calculated, which is useful to shift natural frequencies of the antenna system 10, of the coupled system including the antenna system 10, suspension system 200 and support structure 50, or of both the antenna system 10 and the coupled system, outside the relevant frequency range.

Figure 9:
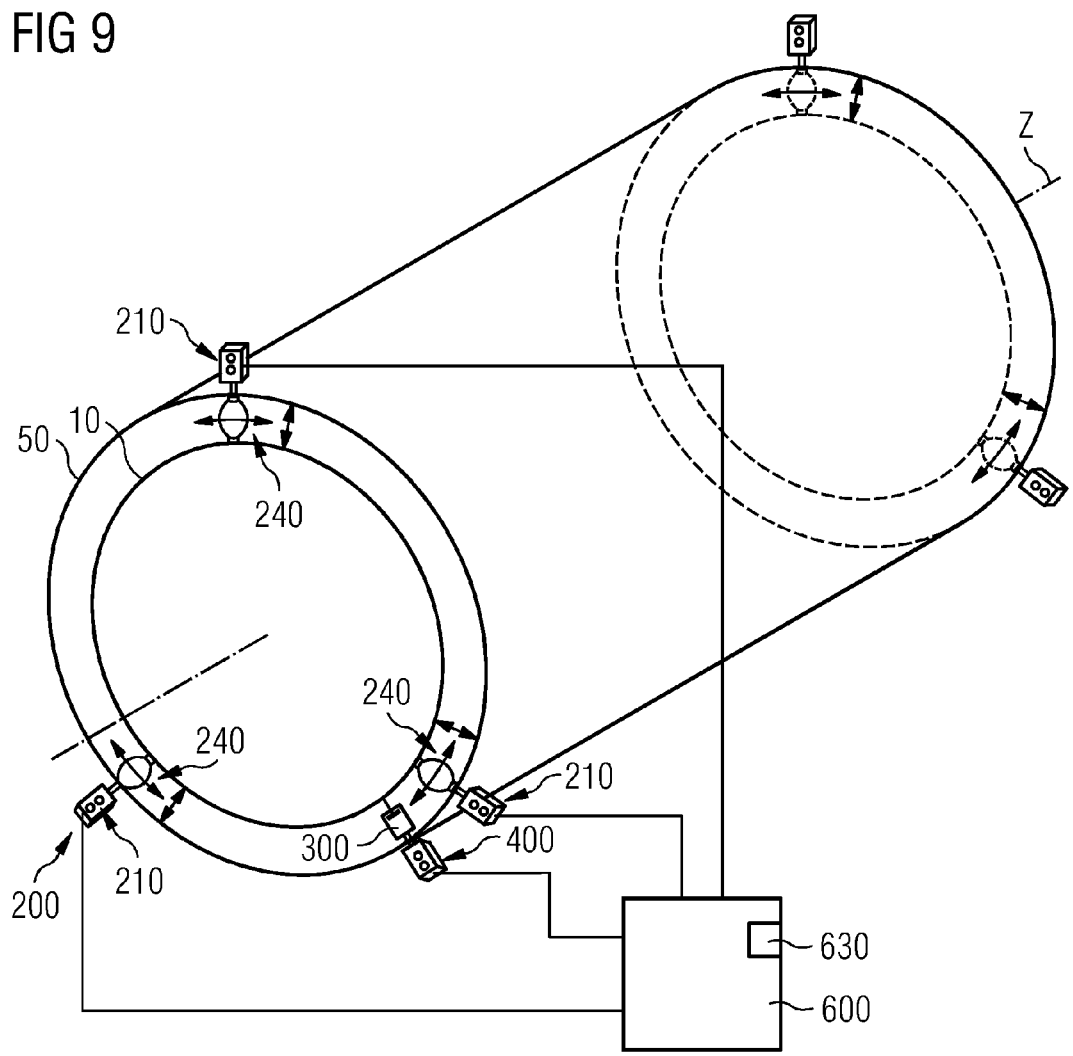
FIG. 9 shows one embodiment of a body coil connected to a gradient coil via adjustable air cushions, the air cushions being uniformly distributed over the circumference of the cylindrical body coil.

FIG. 9 shows a suspension system 200 that includes a plurality of actuators/setters 210 or actuatable setting mechanisms. The plurality of actuators/setters 210 may be configured as air cushions or "air muscles" 210. The plurality of actuators/setters 210 may support the body coil 10 relative to the gradient coil 50 while being uniformly distributed over the circumference of the body coil 10 at a plurality of points. The setters 210, e.g., the pressure elements that may be filled with a fluid, therefore simultaneously form suspension units 240. The exemplary embodiment depicted includes two groups of three air muscles respectively arranged in the region of the end face (e.g., side) of the body coil 10. The air pressure in the setter 210 is in this case adjustable. The driving of the setter 210 may thus be implemented pneumatically. To this end, the air muscles 210 may be connected individually or as a whole to a pump system (not shown) for a filling medium. The pump system may be activated during operation of the magnetic resonance imaging system.

As an alternative to the configuration as air muscles, other filling media may be used, such as oil, helium or nitrogen. To this extent, a hydraulic drive of the setters 210 may also be provided, and there may be a corresponding pump system as the drive mechanism.

A suitable combination of a plurality of filling media may also be used. The plurality of filling media may have different damping properties or different compressibility. In this case, at least one of the setters 210 may be operated with a different filling medium than the other setters 210. The damping properties of the setter 210 operated with a different filling medium are such that the properties are maximal at a different frequency than for the other setters 210. Effective damping over a wide frequency range may be produced and modified via a multiplicity of connection points between the body coil 10 and the gradient coil 50. Such damping may be provided by individual driving of the setters 210, e.g., with different filling pressures.

At the same time, the modified damping supports variation of the coupling parameter value of the coupled system including the antenna system 10, suspension system 200 and support structure 50. The natural oscillation modes or natural frequencies of the coupled system may thus be varied with the aid of the setters 210. The variation may also be reversible.

Furthermore, the suspension system 200 includes a sensor 300 configured to establish natural oscillations of the antenna system 10. The sensor 300 may also be simultaneously used as part of a location determination device 400.

In this case, the magnetic scanner may also include a plurality of sensors 300 so that the deflection of the antenna system 10 is detected at more than a single position. In this way, the weight distribution of the patient in the magnetic resonance imaging system may be established. The distribution of weight of the patient may thus be considered in the shift, damping, or both shift and damping of (natural) frequencies.

The sensor 300 is depicted in more detail in FIG. 10. In this case, a piston 320 may be shifted in a certain direction in a cylinder 310 filled with a measurement medium, such as oil, air, helium or nitrogen. The direction of the shift may coincide with a direction in which associated setters 210 may exert a force. The measurement medium may be the same medium as the medium with which one of the setters 210 is operated. The cylinder 310 is coupled to a compensation container 330. In the event of movement of the body coil 10, the piston is moved in the cylinder proportionally to the deflection of the body coil 10. The compensation container 330 may be closed, so that the movement of the piston causes a pressure difference in the measurement medium. The pressure difference may be determined, so that a deflection of the body coil 10 may be calculated therefrom. Pressure sensors, such as piezoelectric sensors, capacitive sensors, glass scales or strain gages may be used.

Alternatively, the compensation container 330 may be open. The filling level of the measurement medium in the compensation container may then be determined in order to ascertain the deflection of the body coil 10.

In this way, the relative location of the body coil 10 with respect to the support structure, or gradient coil 50 may be established. The sensor 300 therefore becomes part of a location determination device 400. A correction of the position of the body coil 10 relative to the gradient coil 50 may then be implemented in a similar way as in the exemplary embodiment of FIG. 8 by actuating the setters 210. However, in this case, the setters 210 are configured as the described air muscle system, or a system of pressure elements that may be filled with a fluid.

As shown in FIG. 9, the sensor 300 is connected to a suspension control device 600 configured to vary, control and regulate the relative position of the antenna system 10 relative to the support structure 50.

The active suspension system 200 of FIG. 9, in combination with the suspension control device 600, may automatically keep the location of the body coil 10 relative to the gradient coil 50 substantially constant, such as in a mutually concentric arrangement of the body coil 10 and the gradient coil 50. The location may be constant irrespective of the weight load due to a patient.

Furthermore, the suspension control device 600 is configured to actuate the arrangement of setters 210 and implement a shift of a natural frequency of the coupled system including the antenna system 10, suspension system 200 and support structure 50. With the multiplicity of individually actuable setters 210, the shift of natural frequencies may be implemented independently of the correction of the relative position of the body coil 10 relative to the gradient coil 50.

The suspension control device 600 may have a frequency range interface 630, through which information about the relevant frequency range may be dynamically received. The relevant frequency range may be provided by an expert system. A differential frequency may already be provided via the interface 630 for shifting natural frequencies of the antenna system 10, of the coupled system including the antenna system 10, suspension system 200 and support structure 50, or both the antenna system 10 and the coupled system. Furthermore, the suspension control device 600 may be configured to dynamically establish a differential frequency while considering the aforementioned sensor measurement data.

The pressure of the filling medium in the individual air muscles may then be varied such that the shift by a predetermined differential frequency occurs.

As shown in FIG. 11, a suspension system 200 is configured to reversibly vary a coupling parameter value between the body coil 10 and the support structure 50. In the radial direction, considered transversely to the z-direction, the gradient coil 45 is arranged between the support structure 50 and the body coil in this exemplary embodiment. The suspension system 200 in this case includes a plurality of suspension units 240, on which the antenna system 10 is coupled to a support structure 50 at different points of the antenna system 10. A first suspension unit 240 is fastened on a support structure 50, such as on a housing of a main magnet of the magnetic resonance scanner. The suspension unit 240 includes a fastening element 230 in the form of a roll, the rotation axis of which extends parallel to the z-direction. A cable 220A may be elastic and may be part of the suspension unit 240. The cable 220A is connected to the antenna system 10 at both ends, and extends around the roll 230. The cable 220A includes a spring 220B, which acts as a damping element 220B, and the cable 220A furthermore respectively includes a strain gage 300 used as a sensor element 300, in order to detect a natural frequency of the antenna system, or of the coupled system consisting of the antenna system, suspension system and support structure 50. At the same time the strain gages 300 are also used to establish the relative location of the antenna system 10 with respect to the support structure 50. In particular, the cable tension in the different cables 220A may be established directly. The cables 220A are accordingly regarded as part of a location determination device 400. The fastening elements 230 are in this case configured so that the fastening elements 230 are movable relative to the support structure 50. The fastening elements 230 may be shifted transversely to the z-direction, thereby allowing the cable tension to be varied. Compensation of vibrations of the antenna system, of weight changes, or of both vibrations and weight changes during operation (due to, for example, repositioning of the patient) may therefore be provided by different tensions of the cable 220A.

The shift may be implemented in this case in a similar way to the sensor 300 of the exemplary embodiment of FIG. 10, via a setter 210 configured as a piston in a cylinder. The filling quantity, or the pressure, of the filling medium in the cylinder may in this case be varied, so that the setter 210 may modify the location of the roll 230 relative to the support structure 50 transversely to the z-direction. In the exemplary embodiment, the shift is implemented such that the distance of the roll 230 from the antenna system 10 is also varied. With this variation, the relative location of the antenna system 10 with respect to the support structure 50 is established, and the cable tension is varied. Therefore, a coupling parameter value of the mechanical coupling of the antenna system to the support structure 50 may simultaneously be set, independently of the correction of the relative location of the antenna system 10 with respect to the support structure 50. Alternatively, the springs 220 may be configured so that the spring hardness of the springs 220 may be adjusted. The cable tension may thus be varied. The adjustment of the location of the fastening elements 230 may be implemented synchronously, so that the fastening elements 230 are only used to correct the position of the body coil 10 relative to the gradient coil 50. This correction, in turn, supports independent variation of the location of the antenna system 10 and of the variation of natural frequencies of the coupled system including the antenna system 10, suspension system 200 and support structure 50.

Figure 12:
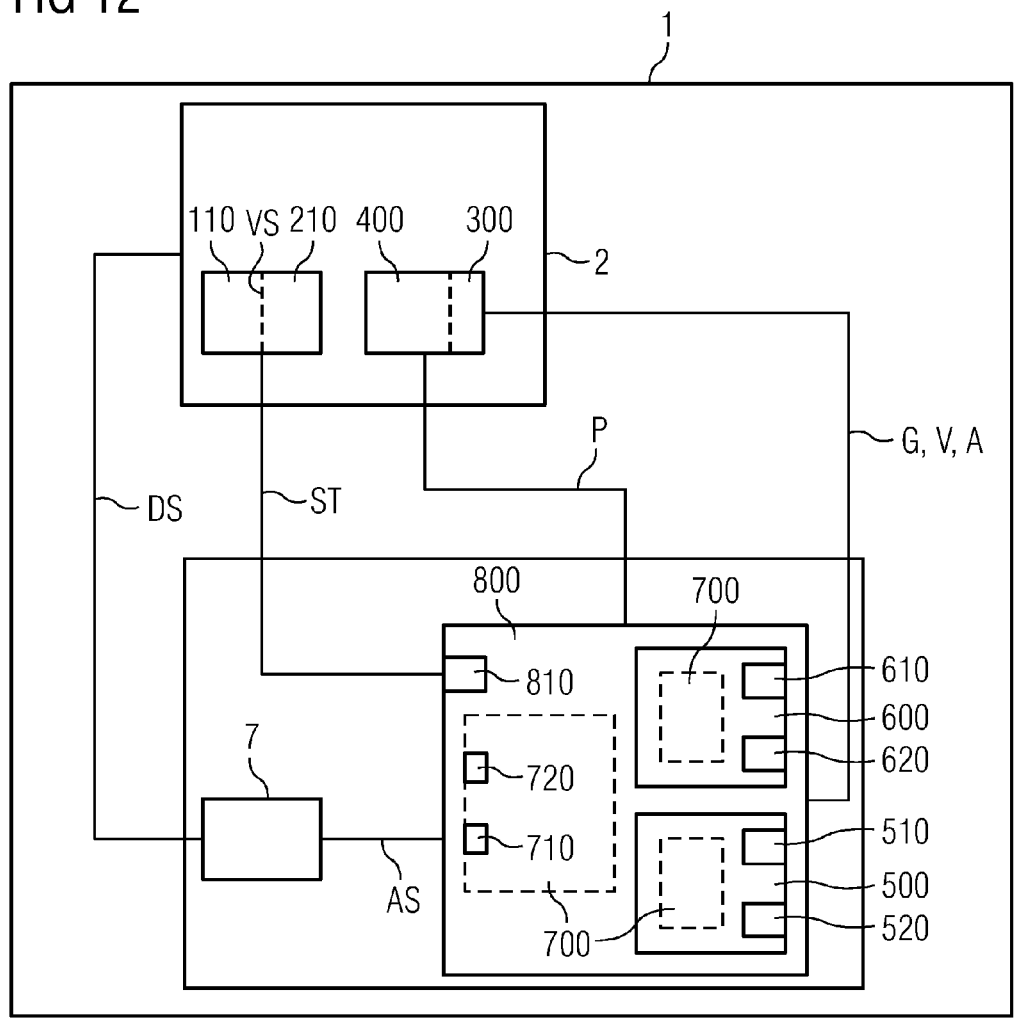
FIG. 12 shows an antenna vibration control system that controls, or regulates, an adjustment device and a setting mechanism based on a prediction by an expert system of a relevant frequency range and sensor measurement data, such as the weight of an examination object.

FIG. 12 schematically shows the actuation or regulation of the setters 110 of the antenna system, of the setters 210 of the suspension system, or both the setters 110 and the setters 210, which may together form a common adjustment system VS.

The MR system 1 has a main control instrument 5 with a sequence control instrument 7. The sequence control instrument is used to transmit actuation sequence data AS to a scanner 2 of the magnetic resonance imaging system 1 to actuate the scanner 2 for a magnetic resonance data acquisition. The actuation sequence data AS is provided to an antenna vibration control system 800 before or during the magnetic resonance measurement. The antenna vibration control system 800 includes a differential frequency control device 500 and a suspension system control device 600. The antenna vibration control system 800 may also include an expert system 700 configured to predict the relevant frequency range or a vibration spectrum or natural oscillation spectrum of the antenna system, or of the combination of the antenna system, suspension system and support structure, based on the actuation sequence AS and optional sensor measurement data.

The sensor measurement data may be weight data G of the examination object obtained with the aid of the sensors 300. The sensor measurement data may be indicative of the weight distribution of the examination object, vibrations or vibration data V, or image artifacts appearing during operation of the magnetic resonance imaging system, such as artifact frequencies A or natural frequencies of the examination object. Furthermore, the sensor information may also include measurement data supplied to the location determination device 400, which calculates location data P of the antenna system therefrom and sends the location data P to the antenna vibration control system 800. Alternatively, the location data P may also be established within the antenna vibration control system 800 based on sensor measurement data.

A multiplicity of different sensors 300 may be used. For example, laser, ultrasound or glass rod systems may be used for the location determination. Furthermore, the location determination may be implemented based on the analysis of an electric scattering parameter matrix, which may be compiled for calibration or setting of RF voltage amplitudes, RF voltage phases for operation of the antenna system, or both RF voltage amplitudes and RF voltage phases. The antenna system alone or in combination with a transmission unit, reception unit, or both transmission and reception unit, are then used as a sensor 300 for the location determination. The location determination may then be implemented such that a threshold value is assigned to each element of the scattering matrix and the location of the antenna system relative to the support structure is established by analysis of the exceeding of the threshold value. The location determination device 400 may be configured to implement this analysis.

In order to establish natural frequencies of the examination object, respiratory belts or EKG devices may be used as sensors 300. Furthermore, MR image data with respect to the natural frequencies of the examination object may be evaluated. In this regard, a reconstruction unit for reconstructing MR image data may also be used as a sensor 300.

The aforementioned strain gages or piezoelectric transducers may establish the tension conditions of cables, cords or springs, or the load of individual fastening elements or suspension units due to the antenna system. In this way, a weight distribution of the examination object in the MR system, or the antenna system, may be determined. To this end, the expert system 700 or the differential frequency control device 500 and the suspension system control device 600 have a weight data interface 520, 620, 720.

The expected spectral distribution of the antenna system vibrations may be calculated in advance via the expert system. The natural frequencies of the antenna system, the combination of the antenna system, suspension system and support structure, or both the antenna system and the combination may be calculated for an initial location of the adjustment devices, of the actuatable setting mechanisms, or of both the adjustment devices and the actuatable setting mechanisms. The natural frequencies are then compared with the relevant frequency range.

Furthermore, the vibration spectrum of the antenna system may be measured via the vibration sensors. Natural frequencies of the antenna system, of the combination of the antenna system, suspension system and support structure, or of both the antenna system and the combination may be measured. The sensors may be vibration sensors, such as accelerometers or microphones, disposed in, at or on the body coil.

The comparison between the relevant frequency range and the predicted or measured natural frequencies is implemented by the expert system 700.

The expert system 700 is configured to establish one or more differential frequencies based on the comparison. The expert system 700 is configured to specify the frequencies for one or more natural oscillation modes. The expert system 700 is configured to transmit the frequencies to the differential frequency control device 500, the suspension system control device 600, or both the differential frequency control device 500 and the suspension system control device 600.

Alternatively, the comparison may be implemented by the differential frequency control device 500, the suspension system control device 600, or both the differential frequency control device 500 and the suspension system control device 600.

To this end, the relevant frequency range, an expected or measured oscillation spectrum, or both the relevant frequency range and an oscillation spectrum may be transmitted by the expert system 700 to the differential frequency control device 500, to the suspension system control device 600, or to both the differential frequency control device 500 and the suspension system control device 600. The relevant frequency range transmitted to the differential frequency control device 500 may in this case be different than the relevant frequency range transmitted to the suspension system control device 600.

Alternatively, the differential frequency control device 500, the suspension system control device 600, or both the differential frequency control device 500 and the suspension system control device 600 may also be configured to predict, empirically establish, or both predict and empirically establish the respective relevant frequency range, the respectively relevant oscillation spectrum, or both the frequency range and the oscillation spectrum based on actuation sequence data AS, sensor measurement values, such as weight data G, or both actuation sequence data AS and sensor measurement values.

For example, to this end, the expert system 700 may also be integrated into the differential frequency control device 500 and/or into the suspension system control device 600. The differential frequency control device 500 and the suspension system control device 600 may also be configured as one component.

If a differential frequency is not already specified, e.g., by the expert system 700, then the differential frequency control device 500 establishes a differential frequency in order to shift a natural frequency of the antenna system out of the relevant frequency range. Based on the established or specified differential frequency, the differential frequency control device 500 drives the setters 110 of the antenna system appropriately.

In the same way, the suspension system control device 600 establishes a coupling parameter value based on the differential frequency that shifts a natural frequency of the coupled system, including the antenna system, suspension system and support structure. As a result, the natural frequency lies outside the relevant frequency range. The suspension system control device 600 drives the setters 210 of the suspension system appropriately.

The setters 110, 210 are actuated by transmitting control data ST via a control interface 810 of the antenna vibration control system 800. Optionally, the differential frequency control device 500 and/or the suspension system control device 600 may likewise have a control interface (not shown) for transmitting control data ST to the setters 110, 210. In this case, the control interface 810 of the antenna vibration control system 800 may then be dispensed with.

The comparison between the natural frequency spectrum, or vibration spectrum, and the relevant frequency range may be implemented repeatedly. For example, a differential frequency may be established or specified iteratively based on the aforementioned sensor measurement data. The iterative specification is implemented, for example, by variation calculation. The setters 110, 210 are first actuated by control data ST and a difference from an expected natural frequency determined with the aid of control data ST, or differential frequency, is established. The control data ST is varied iteratively until the difference is minimal.

The iterative specification may also be implemented such that actuation sequence data AS is considered in the variation calculation. To this end, the expert system or the differential frequency control device 500 and/or the suspension system control device 600 may have a sequence interface 510, 610, 710.

The disclosed embodiments provide a range of possibilities for minimizing influences of oscillations of an antenna system on the quality of the imaging or the patient comfort, or the SAR exposure of the patient. To this end, for example, the adjustment of the body coil before delivery of the associated magnetic resonance imaging system and also continuously (e.g., during maintenance work and during operation of the MR system) is simplified because the adjustment may be implemented dynamically and automatically improved iteratively. The vibration problem with respect to the imaging may be reduced without having to damp the entire vibration spectrum. The automatic adjustment of the location of the body coil inside the gradient coil (such that the location is independent of the weight load due to a patient) improves the SAR exposure of the patient and the energy budget of the MR scanner. Those improvements are useful in the case of antenna systems connected to a plurality of transmission channels (or transmission arrays) of the MR system.

Finally, it should be pointed out that the features of all exemplary embodiments, or developments disclosed in figures, may be used in any desired combination. It is likewise to be pointed out that the medical technology imaging system described in detail above, the MR scanner, and the method for operating an MR system and for setting a natural frequency of an antenna system mechanically connected to a magnetic resonance imaging system, are merely exemplary embodiments that may be modified in the widest variety of ways without departing from the scope of the invention. In particular, the described drive mechanism may be used with any type of the setters described. Furthermore, the use of the indefinite article "a" or "an" does not preclude the possibility that there may be several of the relevant features. Likewise, the term "unit" does not preclude the possibility that the relevant components may include a plurality of interacting subcomponents, which may optionally also be spatially distributed.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A magnetic resonance scanner comprising:
   an antenna system;
   an adjustment device configured to set a natural frequency of a natural mechanical oscillation mode of the antenna system to a desired frequency;
   a suspension system to establish a mechanical coupling between the antenna system and a support structure;
   wherein the suspension system has a setting mechanism configured to reversibly set a coupling parameter value of the mechanical coupling between the antenna system and the support structure, a location of the antenna system relative to the support structure, or both the coupling parameter value and the location.

2. The magnetic resonance scanner of claim 1, wherein the suspension system is configured such that the coupling parameter value is set between a first coupling parameter value and a second coupling parameter value to shift the natural frequency of a coupled system comprising the antenna system and the support structure.

3. The magnetic resonance scanner of claim 1, wherein the suspension system is configured to set the location independently of a change in the coupling parameter value.

4. The magnetic resonance scanner of claim 1, further comprising a location determination device that directly or indirectly establishes the location of the antenna system relative to the support structure.

5. The magnetic resonance scanner of claim 1, wherein the suspension system comprises a plurality of suspension units that connect the antenna system to the support structure at a plurality of different coupling points.

6. The magnetic resonance scanner of claim 5, further comprising a sensor arrangement configured to detect a distribution of weight of an examination object disposed on the plurality of suspension units.

7. The magnetic resonance scanner of claim 1, further comprising at least one sensor element selected from the group of a strain gage, a piezoelectric element, a laser and laser radiation receiver, an ultrasound transmitter and ultrasound receiver, a glass rod position determination system, a weighing apparatus, an accelerometer, a microphone, a vibration measuring device configured to determine whether a vibration occurred during imaging, and a location determination device configured to determine the location of the antenna system relative to a further component of the magnetic resonance scanner based on RF transmission pulses of the antenna system.

8. A magnetic resonance imaging system comprising:
a support structure; and
a magnetic resonance scanner comprising:
an antenna system;
a suspension system to establish a mechanical coupling between the antenna system and the support structure;
a suspension control device comprising a weight data interface for weight data, the suspension control device configured to control, regulate, or both control and regulate, as a function of the weight data, a coupling parameter value, a location of the antenna system relative to the support structure, or both the coupling parameter value and the location of the antenna system relative to the support structure;
wherein the suspension system has a setting mechanism configured to adjustably set the coupling parameter value of the mechanical coupling between the antenna system and the support structure, the location of the antenna system relative to the support structure, or both the coupling parameter value and the location.

9. The magnetic resonance imaging system of claim 8, wherein the suspension control device comprises a sequence interface for actuation sequence data and is configured to employ the actuation sequence data to control, regulate, or both control and regulate the coupling parameter value, the location of the antenna system relative to the support structure, or both the coupling parameter value and the location of the antenna system relative to the support structure.

10. The magnetic resonance imaging system of claim 8, further comprising a differential frequency control device configured to control, regulate, or both control and regulate a setting of a natural frequency of a natural mechanical oscillation mode of the antenna system.

11. A method for operating a magnetic resonance imaging system, the magnetic resonance imaging system comprising a magnetic resonance scanner, the magnetic resonance scanner comprising an antenna system, the method comprising:
establishing a mechanical coupling between the antenna system and a support structure;
setting a natural frequency of a natural oscillation mode of the antenna system to a desired frequency; and
controlling, regulating, or controlling and regulating a coupling parameter value representative of the mechanical coupling, of a position of the antenna system relative to the support structure, or of both the mechanical coupling and the position.

12. The method of claim 11, wherein controlling, regulating, or controlling and regulating is implemented during operation of the magnetic resonance imaging scanner.

13. The method of claim 11, wherein controlling, regulating, or controlling and regulating comprises setting the coupling parameter value between a first coupling parameter value and a second coupling parameter value to shift the natural frequency of a coupled system comprising the antenna system and the support structure.

14. The magnetic resonance scanner of claim 1, wherein the antenna system comprises a body coil.

15. The magnetic resonance scanner of claim 1, wherein the setting mechanism is configured to reversibly set the coupling parameter value during operation of the magnetic resonance imaging scanner.

16. The magnetic resonance scanner of claim 2, wherein:
an amplitude of a natural oscillation at the shifted natural frequency is damped relative to non-shifted natural oscillation that occurs at the second coupling parameter value; and
further non-shifted natural oscillation occurs in connection with coupling at the first coupling parameter value.

17. A magnetic resonance imaging system comprising:
a support structure; and
a magnetic resonance scanner comprising:
an antenna system;
a suspension system to establish a mechanical coupling between the antenna system and the support structure;
a suspension control device configured to control, regulate, or both control and regulate, a coupling parameter value, a location of the antenna system relative to the support structure, or both the coupling parameter value and the location of the antenna system relative to the support structure; and
a differential frequency control device configured to control, regulate, or both control and regulate a setting of a natural frequency of a natural mechanical oscillation mode of the antenna system to a desired frequency;
wherein the suspension system has a setting mechanism configured to adjustably set the coupling parameter value of the mechanical coupling between the antenna system and the support structure, the location of the antenna system relative to the support structure, or both the coupling parameter value and the location.

* * * * *